(12) United States Patent
Sekiguchi et al.

(10) Patent No.: US 11,302,354 B2
(45) Date of Patent: *Apr. 12, 2022

(54) MAGNETIC RECORDING MEDIUM HAVING CONTROLLED DIMENSIONAL VARIATION

(71) Applicant: Sony Corporation, Tokyo (JP)

(72) Inventors: Noboru Sekiguchi, Miyagi (JP); Minoru Yamaga, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/032,718

(22) Filed: Sep. 25, 2020

(65) Prior Publication Data
US 2021/0020196 A1 Jan. 21, 2021

Related U.S. Application Data

(63) Continuation of application No. 16/463,520, filed as application No. PCT/JP2018/041565 on Nov. 8, 2018, now Pat. No. 10,867,630.

(30) Foreign Application Priority Data

Nov. 8, 2017 (JP) .............................. JP2017-215793

(51) Int. Cl.
*G11B 5/735* (2006.01)
*G11B 5/733* (2006.01)
(Continued)

(52) U.S. Cl.
CPC ............ *G11B 5/62* (2013.01); *C23C 14/0021* (2013.01); *G11B 5/59688* (2013.01); *G11B 5/68* (2013.01);
(Continued)

(58) Field of Classification Search
None
See application file for complete search history.

(56) References Cited

U.S. PATENT DOCUMENTS 6,228,461 B1   5/2001  Sueki et al.
8,535,817 B2 * 9/2013  Imaoka ................ G11B 5/70
                                              428/844
(Continued)

FOREIGN PATENT DOCUMENTS

EP    1983512       10/2008
JP    2002210820     7/2002
(Continued)

OTHER PUBLICATIONS

International Search Report and Written Opinion issued in connection with International Patent Application No. PCT/JP2018/041565 dated Jan. 15, 2019. (9 pages).

(Continued)

*Primary Examiner* — Kevin M Bernatz
(74) *Attorney, Agent, or Firm* — K&L Gates LLP

(57) ABSTRACT

The average thickness $t_T$ of a magnetic recording medium meets the requirement that $t_T \leq 5.5$ [μm], and the dimensional change amount Δw in the width direction of the magnetic recording medium with respect to the tension change in the longitudinal direction of the magnetic recording medium meets the requirement that 700 ppm/N ≤ Δw.

20 Claims, 5 Drawing Sheets

(51) Int. Cl.
*G11B 5/706* (2006.01)
*G11B 5/62* (2006.01)
*C23C 14/00* (2006.01)
*G11B 5/68* (2006.01)
*G11B 5/596* (2006.01)

(52) U.S. Cl.
CPC ...... *G11B 5/70642* (2013.01); *G11B 5/70678* (2013.01); *G11B 5/733* (2013.01); *G11B 5/735* (2013.01); *G11B 5/7358* (2019.05)

(56) References Cited

U.S. PATENT DOCUMENTS

| | | | |
|---|---|---|---|
| 10,665,259 B1* | 5/2020 | Yamaga | G11B 5/70 |
| 10,720,181 B1* | 7/2020 | Yamaga | G11B 5/667 |
| 10,796,724 B1* | 10/2020 | Nakashio | G11B 27/3027 |
| 10,803,904 B1* | 10/2020 | Yamaga | G11B 5/73 |
| 10,839,846 B2* | 11/2020 | Yamaga | G11B 5/62 |
| 10,839,847 B2* | 11/2020 | Terakawa | G11B 5/62 |
| 10,867,630 B2* | 12/2020 | Sekiguchi | C23C 14/562 |
| 10,923,148 B2* | 2/2021 | Enomoto | G11B 5/70678 |
| 10,937,457 B2* | 3/2021 | Yamaga | G11B 5/78 |
| 10,964,346 B2* | 3/2021 | Yamaga | G11B 5/00813 |
| 10,978,104 B2* | 4/2021 | Yamaga | G11B 5/70678 |
| 10,984,833 B2* | 4/2021 | Yamaga | G11B 5/667 |
| 11,017,809 B2* | 5/2021 | Yamaga | G11B 5/00813 |
| 11,056,143 B2* | 7/2021 | Yamaga | G11B 5/78 |
| 2002/0011934 A1 | 8/2002 | Takahashi et al. | |
| 2004/0089564 A1 | 5/2004 | Kuse et al. | |
| 2004/0247859 A1 | 12/2004 | Sasaki et al. | |
| 2004/0265638 A1 | 12/2004 | Sexton | |
| 2005/0153170 A1 | 7/2005 | Inoue et al. | |
| 2005/0260458 A1 | 11/2005 | Hirai | |
| 2006/0061898 A1* | 3/2006 | Nakao | G11B 5/584 360/31 |
| 2006/0087767 A1 | 4/2006 | Hirai | |
| 2006/0092547 A1 | 5/2006 | Kawakami et al. | |
| 2006/0187589 A1 | 8/2006 | Harasawa et al. | |
| 2007/0230054 A1 | 10/2007 | Takeda et al. | |
| 2008/0055777 A1 | 3/2008 | Rou et al. | |
| 2013/0172515 A1 | 7/2013 | Horie et al. | |
| 2017/0221513 A1 | 8/2017 | Hiroi et al. | |
| 2018/0082710 A1 | 3/2018 | Tada et al. | |
| 2019/0180781 A1 | 6/2019 | Handa et al. | |
| 2020/0321032 A1* | 10/2020 | Nakashio | G11B 23/0312 |
| 2020/0342901 A1* | 10/2020 | Enomoto | G11B 5/714 |
| 2020/0342902 A1* | 10/2020 | Enomoto | G11B 5/73 |
| 2020/0342907 A1* | 10/2020 | Yamaga | G11B 5/714 |
| 2020/0411043 A1* | 12/2020 | Yamaga | G11B 5/62 |
| 2021/0012798 A1* | 1/2021 | Terakawa | G11B 5/70678 |
| 2021/0151075 A1* | 5/2021 | Yamaga | G11B 5/133 |
| 2021/0174830 A1* | 6/2021 | Yamaga | G11B 5/73927 |
| 2021/0241797 A1* | 8/2021 | Yamaga | G11B 5/716 |
| 2021/0249044 A1* | 8/2021 | Nakashio | G11B 23/107 |
| 2021/0249045 A1* | 8/2021 | Yamaga | G11B 5/70 |
| 2021/0280214 A1* | 9/2021 | Yamaga | G11B 5/78 |

FOREIGN PATENT DOCUMENTS

| | | |
|---|---|---|
| JP | 2004005898 | 1/2004 |
| JP | 2004030809 | 1/2004 |
| JP | 2005-276258 A | 10/2005 |
| JP | 2005-285268 A | 10/2005 |
| JP | 2005-332510 A | 12/2005 |
| JP | 2005346865 | 12/2005 |
| JP | 2006-107597 A | 4/2006 |
| JP | 2006099919 | 4/2006 |
| JP | 2006216195 | 8/2006 |
| JP | 2007294079 | 8/2007 |
| JP | 2007305197 | 11/2007 |
| JP | 2009087471 | 4/2009 |
| JP | 2009223923 | 10/2009 |
| JP | 2011181121 | 9/2011 |
| JP | 2015135717 | 7/2015 |
| JP | 2017-191633 A | 10/2017 |
| WO | 1999029488 | 6/1999 |
| WO | 2017/085931 A1 | 5/2017 |

OTHER PUBLICATIONS

Extended European Search Report dated Jul. 6, 2020 in corresponding European Application No. 18875050.9.

* cited by examiner

MAGNETIC RECORDING MEDIUM HAVING CONTROLLED DIMENSIONAL VARIATION

CROSS REFERENCE TO RELATED APPLICATIONS

The present application is a continuation of U.S. application Ser. No. 16/463,520, filed on May 23, 2019, which application claims the benefit of International Application No. PCT/JP2018/041565, filed Nov. 8, 2018, which claims priority to Japanese Application No. 2017-215793, filed Nov. 8, 2017, the disclosures of which are incorporated herein by reference.

BACKGROUND

The present disclosure relates to a magnetic recording medium.

In recent years, magnetic tapes (magnetic recording media) used as data storages for computers have been very narrow in track width and distance between adjacent tracks, in order to improve the data recording density. When the track width and the distance between the tracks are made narrow as just described, the maximum allowable change amount becomes smaller and smaller as the dimensional change amount of the tape itself due to environmental factors such as changes in temperature and humidity.

For this reason, Patent Document 1 proposes a magnetic tape medium capable of keeping down the dimensional change in the width direction due to environmental factors and securing stable recording/reproducing characteristics with less offtrack. Furthermore, Patent Document 1 mentions the reduced dimensional change amount in the width direction with respect to the tension change in the longitudinal direction.

CITATION LIST

Patent Document

Patent Document 1: Japanese Patent Application Laid-Open No. 2005-332510

SUMMARY

Problems to be Solved by the Invention

An object of the present disclosure is to provide a magnetic recording medium capable of reducing a change in width by adjustment of the tension in the longitudinal direction.

Solutions to Problems

In order to solve the problem described above, the present disclosure provides a magnetic recording medium, where the average thickness $t_T$ meets the requirement that $t_T \leq 5.5$ [μm], and the dimensional change amount Δw in the width direction with respect to the tension change in the longitudinal direction meets the requirement that 700 [ppm/N]≤Δw.

Effects of the Invention

According to the present disclosure, the change in the width can be reduced by adjustment of the tension in the longitudinal direction. Note that the advantageous effect described herein is not to be considered necessarily limited, and any of the advantageous effects described in the present disclosure, or different advantageous effects may be achieved.

DETAILED DESCRIPTION

Embodiments of the present disclosure will be described in the following order.

1 First Embodiment (Example of Coating Type Magnetic Recording Medium)
2 Second Embodiment (Example of Vacuum Thin Film Type Magnetic Recording Medium)
3 Third Embodiment (Example of Vacuum Thin Film Type Magnetic Recording Medium)

1 First Embodiment

[Overview]

The inventors have studied a recording/reproducing device capable of keeping the width of an elongated magnetic recording medium constant or substantially constant by adjusting the tension in the longitudinal direction of the magnetic recording medium. According to the findings of the inventors, however, common magnetic recording media are small in the dimensional change amount in the width direction with respect to the tension change in the longitudinal direction as described above, and it is thus difficult for the recording/reproducing device mentioned above to keep the width of the magnetic recording medium constant or substantially constant.

Therefore, the inventors have intensively studied a magnetic recording medium capable of keeping the width of the magnetic recording medium constant or substantially constant by the recording/reproducing device mentioned above. As a result, the inventors have created, in contrast to the above-mentioned common magnetic recording media, a magnetic recording medium that has an increased dimensional change amount in the width direction with respect to the tension change in the longitudinal direction, specifically, a magnetic recording medium where the dimensional change amount Δw in the width direction with respect to the tension change in the longitudinal direction meets the requirement that 700 [ppm/N]≤Δw.

[Configuration of Magnetic Recording Medium]

Figure 1:
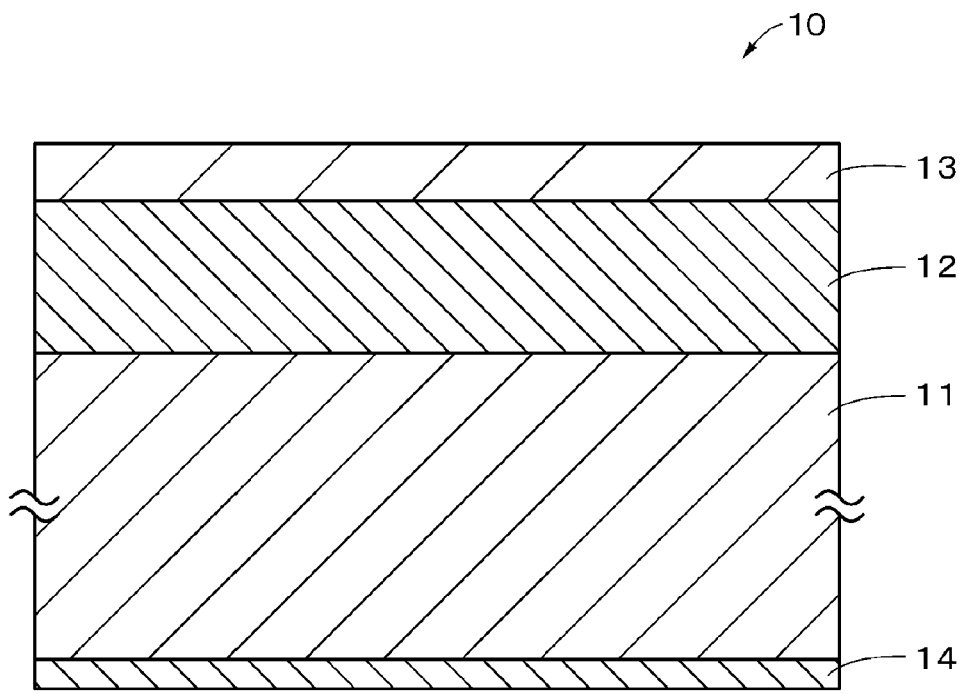
FIG. 1 is a cross-sectional view illustrating the configuration of a magnetic recording medium according to a first embodiment.

First, the configuration of a magnetic recording medium 10 according to the first embodiment will be described with reference to FIG. 1. The magnetic recording medium 10, which is a vertical magnetic recording-type magnetic recording medium, includes, as shown in FIG. 1, an elongated substrate 11, an base layer (nonmagnetic layer) 12 provided on one main surface of the substrate 11, a recording layer (magnetic layer) 13 provided on the base layer 12, and a back layer 14 provided on the other main surface of the substrate 11. Note that the back layer 14 is provided as necessary, and may be omitted. Hereinafter, of the main surfaces of the magnetic recording medium 10, the surface on the side with the recording layer 13 provided is referred to as a magnetic surface, and the opposite surface on the side with the back layer 14 provided is referred to as a back surface.

The magnetic recording medium 10 has an elongated shape, and runs in the longitudinal direction for recording/reproducing. Furthermore, the magnetic recording medium 10 is configured to be capable of recording a signal at a shortest recording wavelength of preferably 100 nm or less, more preferably 75 nm or less, still more preferably 60 nm or less, particularly preferably 50 nm or less, and used for, for example, a recording/reproducing device that has a shortest recording wavelength in the range mentioned above. This recording/reproducing device may include a ring-type head as a recording head. The recording track width is, for example, 2 μm or less.

(Substrate)

The substrate 11 to serve as a support is an elongated nonmagnetic substrate that has flexibility. The nonmagnetic substrate is a film, and the thickness of the film is, for example, 3 μm or more and 8 μm or less. The substrate 11 includes, for example, at least one of polyesters, polyolefins, cellulose derivatives, vinyl resins, or other polymer resins. In a case where the substrate 11 includes two or more of the above-mentioned materials, the two or more materials may be mixed, copolymerized, or laminated.

The polyesters include, for example, at least one of polyethylene terephthalate (PET), polyethylene naphthalate (PEN), polybutylene terephthalate (PBT), polybutylene naphthalate (PBN), polycyclohexylenedimethylene terephthalate (PCT), polyethylene-p-oxybenzoate (PEB), or polyethylene bisphenoxycarboxylate.

The polyolefins include, for example, at least one of polyethylene (PE) or polypropylene (PP). The cellulose derivative includes, for example, at least one of cellulose diacetate, cellulose triacetate, cellulose acetate butyrate (CAB), or cellulose acetate propionate (CAP). The vinyl resin includes, for example, at least one of polyvinyl chloride (PVC) or polyvinylidene chloride (PVDC).

The other polymer resins include, for example, at least one of polyamide ((PA), nylon), aromatic polyamide (aromatic PA, aramid), polyimide (PI), aromatic polyimide (aromatic PI), polyamide imide (PAI), aromatic polyamide imide (aromatic PAI), polybenzoxazole ((PBO), for example, ZYLON (registered trademark)), polyether, polyether ketone (PEK), polyether ester, polyether sulfone (PES), polyether imide (PEI), polysulfone (PSF), polyphenylene sulfide (PPS), polycarbonate (PC), polyarylate (PAR), or polyurethane (PU).

(Recording Layer)

The recording layer 13 is a so-called vertical recording layer, which includes, for example, a magnetic powder, a binder, and conductive particles. If necessary, the recording layer 13 may further include additives such as a lubricant, an abrasive, and a rust inhibitor.

The average thickness $t_m$ of the recording layer 13 preferably meets the requirement that 35 [nm]≤$t_m$≤90 [nm]. When the average thickness $t_m$ of the recording layer 13 meets the requirement that 35 [nm]≤$t_m$≤90 [nm], the electromagnetic conversion characteristics can be improved.

The average thickness $t_m$ of the recording layer 13 is determined as follows. First, the magnetic recording medium 10 is processed to be thin perpendicularly to the main surface, thereby preparing a sample piece, and the cross section of the test piece is observed with a transmission electron microscope (TEM) under the following conditions.

Equipment: TEM (H9000NAR manufactured by Hitachi, Ltd.)

Acceleration voltage: 300 kV

Magnification: 100,000-fold magnification

Next, with the use of the obtained TEM image, after measuring the thickness of the recording layer 13 at the positions of at least 10 points or more in the longitudinal direction of the magnetic recording medium 10, the measured values are simply averaged (arithmetic mean), and regarded as the average thickness $t_m$ (nm) of the recording layer 13.

(Magnetic Powder)

The magnetic powder includes a powder of nanoparticles containing an ε-iron oxide (hereinafter referred to as "ε-iron oxide particles"). Even if the ε-iron oxide particles are fine particles, a high coercive force can be obtained. Preferably, the ε-iron oxide contained in the ε-iron oxide particles preferentially have crystals oriented in the thickness direction (vertical direction) of the magnetic recording medium 10.

The ε-iron oxide particles have a spherical shape or a substantially spherical shape, or have a cubic shape or a substantially cubic shape. The ε-iron oxide particles have the shape as mentioned above, and thus, in a case where the ε-iron oxide particles are used as magnetic particles, the area of contact between the particles in the thickness direction of the medium can be reduced, thereby inhibiting the aggregation of the particles, as compared with a case of using hexagonal plate-shaped barium ferrite particles as magnetic particles. Thus, the dispersibility of the magnetic powder can be enhanced, thereby providing a more favorable signal-to-noise ratio (SNR).

Figure 2:
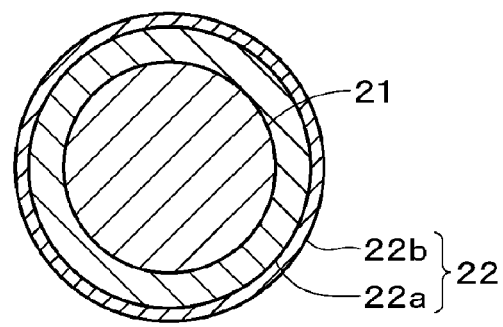
FIG. 2 is a cross-sectional view illustrating the configuration of a magnetic particle.

The ε-iron oxide particles have a core-shell type structure. Specifically, as shown in FIG. 2, the ε-iron oxide particle includes a core part 21 and a shell part 22 that has a two-layer structure provided around the core part 21. The shell part 22 that has a two-layer structure includes a first shell part 22a provided on the core part 21 and a second shell part 22b provided on the first shell part 22a.

The core part 21 contains an ε-iron oxide. The ε-iron oxide contained in the core part 21 preferably has an ε-$Fe_2O_3$ crystal as a main phase, and more preferably a single-phase ε-$Fe_2O_3$.

The first shell part 22a covers at least a part of the periphery of the core part 21. Specifically, the first shell part 22a may partially cover the periphery of the core part 21, or may cover the entire periphery of the core part 21. From the viewpoint of sufficient exchange coupling between the core part 21 and the first shell part 22a for improvement of magnetic characteristics, it is preferable to cover the entire surface of the core part 21.

The first shell part 22a is a so-called soft magnetic layer, which includes, for example, a soft magnetic material such as α-Fe, a Ni—Fe alloy, or a Fe—Si—Al alloy. The α-Fe may be obtained by reducing the ε-iron oxide contained in the core part 21.

The second shell part 22b is an oxide film as an oxidation prevention layer. The second shell part 22b contains an α-iron oxide, an aluminum oxide, or a silicon oxide. The α-iron oxide contains at least one iron oxide of $Fe_3O_4$, $Fe_2O_3$, or FeO, for example. In a case where the first shell part 22a contains α-Fe (soft magnetic material), the α-iron oxide may be obtained by oxidizing the α-Fe contained in the first shell part 22a.

The ε iron oxide particles have the first shell part 22a as described above, thereby making it possible to adjust the coercive force Hc of the ε-iron oxide particles (core-shell particles) as a whole to a coercive force Hc which is suitable for recording, while maintaining the coercive force Hc of the core part 21 alone at a large value in order to ensure thermal stability. Furthermore, the ε-iron oxide particles have the second shell part 22b as described above, thereby making it possible to keep characteristics of the ε-iron oxide particles from being degraded by the generation of rust and the like on the particle surfaces, with the ε-iron oxide particles exposed to the air in the process of manufacturing the magnetic recording medium 10 and before the process. Therefore, characteristic degradation of the magnetic recording medium 10 can be suppressed.

The average particle size (average maximum particle size) D of the magnetic powder is preferably 22 nm or less, more preferably 8 nm or more and 22 nm or less, and still more preferably 12 nm or more and 22 nm or less.

The average particle size D of the magnetic powder mentioned above is determined as follows. First, the magnetic recording medium 10 to be measured is processed by a focused ion beam (FIB) method or the like to prepare a thin piece, and a cross section of the thin piece is observed with a TEM. Next, 500 ε-iron oxide particles are randomly selected from the taken TEM photograph, and the maximum particle size $d_{max}$ of each particle is measured to obtain the particle size distribution of the maximum particle size $d_{max}$ of the magnetic powder. Here, the "maximum particle size $d_{max}$" means a so-called maximum Feret diameter, and specifically, the maximum distance among the distances between two parallel lines drawn from all angles so as to come into contact with the contour of the ε-iron oxide particle. Thereafter, the median diameter (50% diameter, D50) for the maximum particle size $d_{max}$ is determined from the obtained particle size distribution of the maximum particle size $d_{max}$, and regarded as the average particle size (average maximum particle size) D of the magnetic powder.
(Binder)

As the binder, a resin is preferred which has a structure of a polyurethane resin, a vinyl chloride resin, or the like subjected to a cross-linking reaction. However, the binder is not to be considered limited to the foregoing resins, and other resins may be blended appropriately depending on the physical properties and the like required for the magnetic recording medium 10. The resin to be blended is, typically, not particularly limited as long as the resin is commonly used in the coating-type magnetic recording medium 10.

Examples thereof, for example, include polyvinyl chloride, polyvinyl acetate, vinyl chloride-vinyl acetate copolymers, vinyl chloride-vinylidene chloride copolymers, vinyl chloride-acrylonitrile copolymers, acrylic acid ester-acrylonitrile copolymers, acrylic acid ester-vinyl chloride-vinylidene chloride copolymers, vinyl chloride-acrylonitrile copolymers, acrylic acid ester-acrylonitrile copolymers, acrylic acid ester-vinylidene chloride copolymers, methacrylic acid ester-vinylidene chloride copolymers, methacrylic acid ester-vinyl chloride copolymers, methacrylic acid ester-ethylene copolymers, polyvinyl fluoride, vinylidene chloride-acrylonitrile copolymers, acrylonitrile-butadiene copolymers, polyamide resins, polyvinyl butyral, cellulose derivatives (cellulose acetate butyrate cellulose diacetate, cellulose triacetate, cellulose propionate, nitrocellulose), styrene-butadiene copolymers, polyester resins, amino resins, synthetic rubbers, and the like.

Furthermore, examples of the thermosetting resin or reactive resin include a phenolic resin, an epoxy resin, a urea resin, a melamine resin, an alkyd resin, a silicone resin, a polyamine resin, a urea formaldehyde resin, and the like.

Furthermore, a polar functional group such as —$SO_3M$, —$OSO_3M$, —COOM, and P=$O(OM)_2$ may be introduced into each of the binders described above, for the purpose of improving the dispersibility of the magnetic powder. Here, M in the formula represents a hydrogen atom or an alkali metal such as lithium, potassium, or sodium.

Moreover, examples of the polar functional group include a side chain type having a terminal group of —NR1R2 or —$NR1R2R3^+X^-$, and a main chain type of >$NR1R2^+X^-$. Here, R1, R2 and R3 in the formula represent a hydrogen atom or a hydrocarbon group, and $X^-$ represents a halogen element ion such as fluorine, chlorine, bromine, or iodine, or an inorganic or organic ion. Furthermore, examples of the polar functional groups also include —OH, —SH, —CN, an epoxy group, and the like.
(Additive)

The recording layer 13 may further contain, as nonmagnetic reinforcing particles, aluminum oxide (α, β, or γ-alumina), chromium oxide, silicon oxide, diamond, garnet, emery, boron nitride, titanium carbide, silicon carbide, titanium carbide, titanium oxide (rutile-type or anatase-type titanium oxide), or the like.
(Base Layer)

The base layer 12 is a nonmagnetic layer including a nonmagnetic powder and a binder as main constituents. The base layer 12 may further include at least one additive such as conductive particles, a lubricant, a curing agent, or a rust inhibitor, if necessary.

The average thickness of the base layer 12 is preferably 0.6 μm or more and 2.0 μm or less, more preferably 0.8 μm or more and 1.4 μm or less. Note that the average thickness of the base layer 12 is determined in a similar manner to the average thickness $t_m$ of the recording layer 13. However, the magnification of the TEM image is adjusted appropriately in accordance with the thickness of the base layer 12.
(Nonmagnetic Powder)

The nonmagnetic powder may be an inorganic substance or an organic substance. Furthermore, the nonmagnetic powder may be carbon black or the like. Examples of the inorganic substance include, for example, metals, metal oxides, metal carbonates, metal sulfates, metal nitrides, metal carbides, metal sulfides, and the like. Examples of the shape of the nonmagnetic powder include, but not limited to, for example, various shapes such as a needle shape, a spherical shape, a cubic shape, and a plate shape.
(Binder)

The binder is similar to that of the above-mentioned recording layer 13.

(Back Layer)

The back layer 14 includes a binder and a nonmagnetic powder. The back layer 14 may include various additives such as a lubricant, a curing agent, and an antistatic agent, if necessary. The binder and the nonmagnetic powder are similar to those of the base layer 12 described above.

The average particle size of the inorganic particles is preferably 10 nm or more and 150 nm or less, more preferably 15 nm or more and 110 nm or less. The average particle size of the inorganic particles can be determined in a similar manner to the average particle size D of the magnetic powder mentioned above.

The average thickness $t_b$ of the back layer 14 is preferably $t_b \leq 0.6$ [µm]. The average thickness $t_b$ of the back layer 14 within the range mentioned above can keep the base layer 12 and the substrate 11 large in thickness, even in a case where the average thickness $t_T$ of the magnetic recording medium 10 is adjusted to $t_T \leq 5.5$ [µm], and thus maintain the running stability of the magnetic recording medium 10 in the recording/reproducing device.

The average thickness $t_b$ of the back layer 14 is determined as follows. First, the magnetic recording medium 10 with a ½-inch width is prepared, and cut into a length of 250 mm to prepare a sample. Next, the thicknesses is measured at five or more points at different sites of the sample with the use of a Laser Hologage manufactured by Mitsutoyo Corporation as a measuring device, and the measured values are simply averaged (arithmetic mean) to calculate an average value $t_T$ [µm]. Subsequently, after removing the back layer 14 of the sample with a solvent such as MEK (methyl ethyl ketone) or a dilute hydrochloric acid or the like, the thicknesses is measured again at five or more points at different sites of the sample with the use of the Laser Hologage mentioned above, and the measured values are simply averaged (arithmetic mean) to calculate an average value $t_B$ [µm]. Thereafter, the average thickness $t_b$ (µm) of the back layer 14 is determined from the following formula.

$$t_b \text{ [µm]} = t_T \text{ [µm]} - t_B \text{ [µm]}$$

(Average Thickness $t_T$ of Magnetic Recording Medium)

The average thickness $t_T$ of the magnetic recording medium 10 meets the requirement that $t_T \leq 5.5$ [µm]. When the average thickness $t_T$ of the magnetic recording medium 10 meets the requirement that $t_T \leq 5.5$ [µm], the recording capacity capable of recording in one data cartridge can be increased more than ever before. The lower limit value of the average thickness $t_T$ of the magnetic recording medium 10 is not to be considered particularly limited, but for example, 3.5 [µm]$\leq t_T$.

The average thickness $t_T$ of the magnetic recording medium 10 is determined in a similar manner to the average value $t_T$ for the average thickness $t_b$ of the back layer 14.

(Dimensional Change Amount Δw)

The dimensional change amount Δw in the width direction of the magnetic recording medium 10 with respect to the change in the tension in the longitudinal direction of the magnetic recording medium 10 meets the requirement that 700 [ppm/N]$\leq$Δw, preferably 750 [ppm/N]$\leq$Δw, more preferably 800 [ppm/N]$\leq$Δw. When the dimensional change amount Δw is Δw<700 [ppm/N], there is a possibility that it will be difficult to reduce the change in width by the adjustment of the tension in the longitudinal direction with the recording/reproducing device. The upper limit value of the dimensional change amount Δw is not to be considered particularly limited, but for example, Δw$\leq$1700000 [ppm/N], preferably Δw$\leq$20000 [ppm/N], more preferably Δw$\leq$8000 [ppm/N]. The dimensional change amount Δw is set to a desired value, for example, by selecting the thickness of the substrate 11 and the material of the substrate 11. Note that one of the thickness of the substrate 11 and the material of the substrate 11 may be selected, or the both may be selected.

The dimensional change amount Δw is determined as follows. First, the magnetic recording medium 10 with a ½-inch width is prepared, and cut into a length of 250 mm to prepare a sample 10S. Next, a load is applied in the order of 0.2 N, 0.6 N, and 1.0 N in the longitudinal direction of the sample 10S, and the width of the sample 10S is measured at the loads of 0.2 N and 1.0 N. Subsequently, the dimensional change amount Δw is determined from the following formula.

$$\Delta w \text{ [ppm/N]} = \frac{D(0.2\text{N}) \text{ [mm]} - D(1.0\text{N}) \text{ [mm]}}{D(0.2\text{N}) \text{ [mm]}} \times \frac{1{,}000{,}000}{(1.0[\text{N}]) - (0.2[\text{N}])} \qquad \text{[Mathematical Formula 1]}$$

(In the formula, D (0.2 N) and D (1.0 N) each represent the width of the sample 10S in a case where the loads of 0.2 N and 1.0 N are applied in the longitudinal direction of the sample 10S.)

Figure 3:
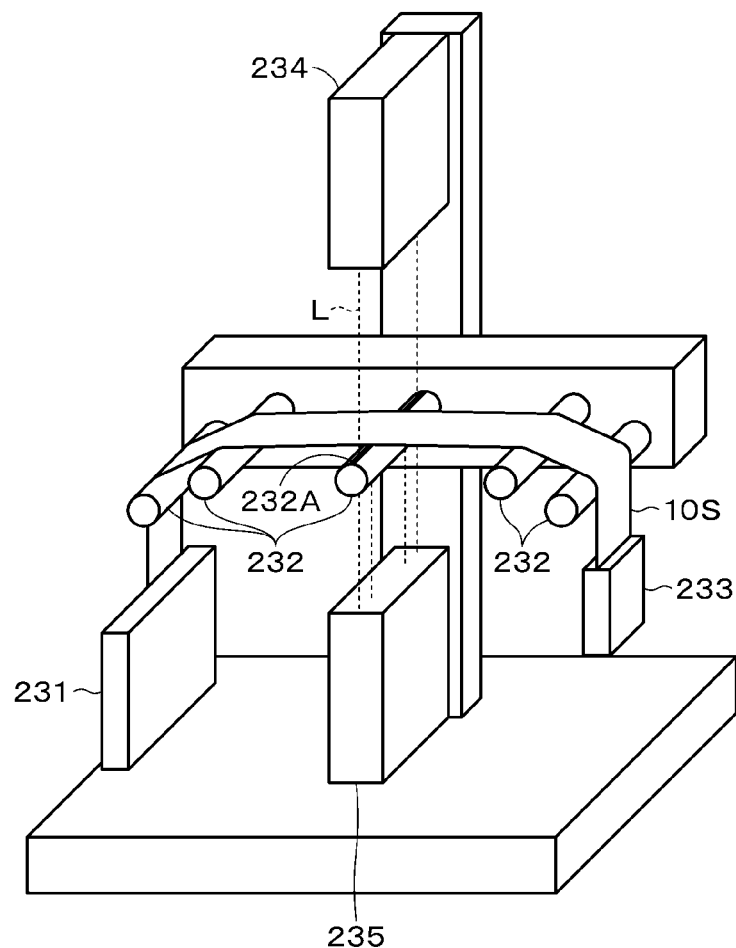
FIG. 3 is a perspective view illustrating the configuration of a measuring device.

Note that the width of the sample 10S in a case where each load is applied is measured as follows. First, the measuring device shown in FIG. 3 in which a digital dimension measuring instrument LS-7000 manufactured by Keyence Corporation is incorporated is prepared as a measuring device, and the sample 10S is set in this measuring apparatus. Specifically, one end of the elongated sample (magnetic recording medium) 10S is fixed by a fixing part 231, and the sample 10S is put over a plurality of rod-shaped support members 232. Note that among the support members 232, the support member 232 located between a light emitter 234 and a light receiver 235 is provided with a slit 232A such that light L is emitted from the light emitter 234 to the light receiver 235 through the slit 232A.

Subsequently, after housing the measuring device in a chamber controlled under a constant environment at a temperature of 25° C. and a relative humidity of 50%, a weight 233 is attached to the other end of the sample 10S, and the sample 10S is adapted to the environment mentioned above. The load applied in the longitudinal direction of the sample 10S can be changed by adjusting the weight of the weight 233. Thereafter, the light L is emitted from the light emitter 234 toward the light receiver 235, and the width of the sample 10S with the load applied thereto in the longitudinal direction is measured. The light emitter 234 and the light receiver 235 are provided in the digital dimension measuring instrument LS-7000.

(Temperature Expansion Coefficient α)

The temperature expansion coefficient α of the magnetic recording medium 10 preferably meets the requirement that 6 [ppm/° C.]$\leq \alpha \leq$8 [ppm/° C.]. When the temperature expansion coefficient α falls within the range mentioned above, the width change of the magnetic recording medium 10 can be further reduced by adjusting the tension in the longitudinal direction of the magnetic recording medium 10 with the recording/reproducing device.

The temperature expansion coefficient α is determined as follows. First, a sample 10S is prepared in a similar manner to the method of measuring the dimensional change amount Δw, and after setting the sample 10S in a measuring device which is similar to that in the method of measuring the dimensional change amount Δw, the measuring device is housed in a chamber controlled to a constant environment at a temperature of 29° C. and a relative humidity of 24%. Next, a load of 0.2 N is applied in the longitudinal direction of the sample 10S, and the sample 10S is adapted to the environment mentioned above. Thereafter, with the relative humidity of 24% maintained, the temperature is changed in the order of 45° C., 29° C., and 10° C., the width of the sample 10S is measured at 45° C. and 10° C., and the temperature expansion coefficient α is determined from the following formula.

$$\alpha \ [ppm/°C.] = \frac{D(45°C.) \ [mm] - D(10°C.) \ [mm]}{D(10°C.) \ [mm]} \times \frac{1{,}000{,}000}{(45[°C.]) - (10[°C.])}$$

[Mathematical Formula 2]

(in the formula, D (45° C.) and D (10° C.) respectively represent the width of the sample 10S at temperatures of 45° C. and 10° C.)

(Humidity Expansion Coefficient β)

The humidity expansion coefficient β of the magnetic recording medium 10 preferably meets the requirement that β≤5 [ppm/% RH]. When the humidity expansion coefficient 13 falls within the range mentioned above, the width change of the magnetic recording medium 10 can be further reduced by adjusting the tension in the longitudinal direction of the magnetic recording medium 10 with the recording/reproducing device.

The humidity expansion coefficient β is determined as follows. First, a sample 10S is prepared in a similar manner to the method of measuring the dimensional change amount Δw, and after setting the sample 10S in a measuring device which is similar to that in the method of measuring the dimensional change amount Δw, the measuring device is housed in a chamber controlled to a constant environment at a temperature of 29° C. and a relative humidity of 24%. Next, a load of 0.2N is applied in the longitudinal direction of the sample 10S, and the sample is adapted to the environment mentioned above. Thereafter, with the temperature of 29° C. maintained, the relative humidity is changed in the order of 80%, 24%, and 10%, the width of the sample 10S is measured at 80% and 10%, and the humidity expansion coefficient β is determined from the following formula.

$$\beta \ [ppm/\% \ RH] = \frac{D(80\%) \ [mm] - D(10\%) \ [mm]}{D(10\%) \ [mm]} \times \frac{1{,}000{,}000}{(80[\%]) - (10[\%])}$$

[Mathematical Formula 3]

(In the formula, D (80%) and D (10%) respectively represent the width of the sample 10S at temperatures of 80% and 10%.)

(Poisson's Ratio ρ)

The Poisson's ratio ρ of the magnetic recording medium 10 preferably meets the requirement that 0.3≤ρ. When the Poisson's ratio ρ falls within the range mentioned above, the width change of the magnetic recording medium 10 can be further reduced by adjusting the tension in the longitudinal direction of the magnetic recording medium 10 with the recording/reproducing device.

The Poisson's ratio ρ is determined as follows. First, the magnetic recording medium 10 with a ½-inch width is prepared, and cut out into a length of 150 mm to prepare a sample, and a central part of the sample is provided with a mark of 6 mm×6 mm in size. Next, both ends in the longitudinal direction of the sample are held with chucks such that the distance between the chucks is 100 mm, and with an initial load of 2 N applied, the length of the mark in the longitudinal direction of the sample in this case is regarded as an initial length, whereas the width of the mark in the width direction of the sample is regarded as an initial width. Subsequently, pulling is carried out in an Instron-type universal tensile testing device at a pulling speed of 0.5 mm/min, and the dimensional change amount is measured for each of the length of the mark in the longitudinal direction of the sample and the width of the mark in the width direction of the sample with an image sensor manufactured by Keyence Corporation. Thereafter, the Poisson's ratio ρ is determined from the following formula.

$$\rho = \frac{\left( \frac{\text{Dimensional Change Amount of Mark Length [mm]}}{\text{(Initial Width [mm])}} \right)}{\left( \frac{\text{Dimensional Change Amount of Mark Length [mm]}}{\text{(Initial Length [mm])}} \right)}$$

[Mathematical Formula 4]

(Elastic Limit Value $\sigma_{MD}$ in Longitudinal Direction)

The elastic limit value $\sigma_{MD}$ in the longitudinal direction of the magnetic recording medium 10 is preferably 0.8 [N]≤$\sigma_{MD}$. When the elastic limit value $\sigma_{MD}$ falls within the range mentioned above, the width change of the magnetic recording medium 10 can be further reduced by adjusting the tension in the longitudinal direction of the magnetic recording medium 10 with the recording/reproducing device. Furthermore, the drive side is easily controlled. The upper limit value of the elastic limit value $\sigma_{MD}$ in the longitudinal direction of the magnetic recording medium 10 is not particularly limited, but $\sigma_{MD}$≤5.0 [N], for example. The elastic limit value $\sigma_{MD}$ is preferably not dependent on the velocity V in making the elastic limit measurement. This is because the elastic limit value $\sigma_{MD}$ is not dependent on the velocity V mentioned above, thereby making it possible to reduce the width change of the magnetic recording medium 10 in an effective manner, without being affected by the running speed of the magnetic recording medium 10 in the recording/reproducing device, or the tension adjustment speed and responsiveness of the recording/reproducing device. The elastic limit value $\sigma_{MD}$ is set to a desired value, depending on, for example, the selection of the curing conditions for the base layer 12, the recording layer 13, and the back layer 14, and the selection of the material of the substrate 11. For example, as the curing time is made longer for a paint for base layer formation, a paint for recording layer formation, and a paint for back layer formation, or as the curing temperature is raised therefor, the reaction between the binder and curing agent included in each of the paints is accelerated. Thus, the elastic characteristic is improved, and the elastic limit value $\sigma_{MD}$ is improved.

The elastic limit value $\sigma_{MD}$ is determined as follows. First, the magnetic recording medium 10 with a ½-inch width is prepared, and cut out into a length of 150 mm to prepare a sample, and both ends in the longitudinal direction of the sample are held with chucks on a universal tensile testing device such that the distance $\lambda_0$ between the chucks is $\lambda_0$=100 mm. Next, the sample is pulled at a pulling speed of 0.5 mm/min, and the load σ(N) is continuously measured with respect to the distance λ (mm) between the chucks. Subsequently, the relation between Δλ (%) and σ (N) is shown graphically with the use of the obtained data of λ (mm) and σ (N). However, Δλ (%) is given by the following formula.

Δλ(%)=((λ−λ0)/λ0)×100

Next, in the graph mentioned above, a region where the graph has a straight line is calculated in the region of σ≥0.2 N, and the maximum load 6 is regarded as the elastic limit value $\sigma_{MD}$(N).

(Interlayer Friction Coefficient μ)

The interlayer friction coefficient μ, between the magnetic surface and the back surface preferably meets the requirement that 0.20≤μ≤0.80. When the interlayer friction coefficient μ, falls within the range mentioned above, winding deviations can be prevented from being caused when the magnetic recording medium 10 is wound around a reel (for example, a reel 10C in FIG. 5). More specifically, when the interlayer friction coefficient μ, is μ<0.20, the interlayer friction between the magnetic surface of a part of the magnetic recording medium 10 already wound on the cartridge reel, located at the outermost periphery, and the back surface of the magnetic recording medium 10 to be newly wound outside around the magnetic surface is extremely decreased, thereby making the magnetic recording medium 10 to be newly wound more likely to deviate from the magnetic surface of the part of the magnetic recording medium 10 already wound on the, located at the outermost periphery. Thus, the magnetic recording medium 10 has a winding deviation caused. On the other hand, when the interlayer friction coefficient μ is 0.80<μ, the interlayer friction between the back surface of the magnetic recording medium 10 which is about to be unwound from the outermost periphery of the drive-side reel and the magnetic surface of the magnetic recording medium 10 remaining wound on the drive reel, located immediately below the back surface, is extremely increased, thereby leading to the back surface and the magnetic surface stuck together. Thus, the unstable operation of the magnetic recording medium 10 toward the cartridge reel causes the magnetic recording medium 10 to have a winding deviation.

The interlayer friction coefficient μ is determined as follows. First, the magnetic recording medium 10 with a ½-inch width is wrapped around a cylinder with a 1-inch diameter, with the back surface facing upward, thereby fixing the magnetic recording medium 10. Next, the magnetic recording medium 10 with a ½-inch width is brought into contact with the cylinder at a holding angle θ (°)=180°+1° to 180°−10° such that the magnetic surface comes into contact with the cylinder, one end of the magnetic recording medium 10 is connected to a movable strain gauge, and a tension T0=0.6 (N) is imparted to the other end thereof. The strain gauge readings T1(N) to T8 (N) for each outward path are measured in reciprocating the movable strain gauge 8 times at 0.5 mm/s, and the average value for T4 to T8 is regarded as $T_{ave}$(N). Thereafter, the interlayer friction coefficient μ is determined from the following formula.

$$\mu = \frac{1}{(\theta[°]) \times (\pi/180)} \times \log_e\left(\frac{T_{ave}[N]}{T_0[N]}\right) \quad \text{[Mathematical Formula 5]}$$

(Surface Roughness $R_b$ of Back Surface)

The surface roughness $R_b$ of the back surface (the surface roughness of the back layer 14) preferably meets the requirement that $R_b$≤6.0 [nm]. When the surface roughness $R_b$ of the back surface falls within the range mentioned above, the electromagnetic conversion characteristics can be improved.

The surface roughness $R_b$ of the back surface is determined as follows. First, the magnetic recording medium 10 with a ½-inch width is prepared, and attached to a glass slide with the back side facing upward, thereby providing a sample piece. Next, the surface roughness of the back surface of the test piece is measured with the following non-contact roughness meter using optical interference.

Equipment: Non-contact roughness meter using optical interference (Non-contact surface/layer sectional shape measuring system VertScan R5500GL-M100-AC manufactured by Ryoka Systems Inc.)

Objective lens: 20-fold magnification (about 237 μm×178 μm visual field)

Resolution: 640 points×480 points

Measurement mode: phase

Wavelength filter: 520 nm

Surface correction: Correction with quadratic polynomial approximation surface

After measuring the surface roughness at the positions of at least five or more points in the longitudinal direction in the way described above, the average value for each arithmetic mean roughness Sa (nm) automatically calculated from the surface profile obtained at each position is regarded as the surface roughness $R_b$ (nm) of the back surface.

(Coercive Force Hc)

The coercive force Hc measured in the thickness direction (vertical direction) of the magnetic recording medium 10 is preferably 220 kA/m or more and 310 kA/m or less, more preferably 230 kA/m or more and 300 kA/m or less, still more preferably 240 kA/m or more It is 290 kA/m or less. When the coercive force Hc is 220 kA/m or more, the coercive force Hc is sufficiently large, and the leakage magnetic field from the recording head can thus keep the magnetization signal recorded on the adjacent track from being degraded. Thus, a better SNR can be obtained. On the other hand, when the coercive force Hc is 310 kA/m or less, saturation recording with the recording head is facilitated, and a better SNR can be thus obtained.

The above-mentioned coercive force Hc is determined as follows. First, a measurement sample is cut out from the elongated magnetic recording medium 10, and the M-H loop for the entire measurement sample is measured in the thickness direction of the measurement sample (the thickness direction of the magnetic recording medium 10) with the use of a vibrating sample magnetometer (VSM). Next, the coating film (the base layer 12, the recording layer 13, and the like) is wiped with the use of acetone, ethanol, or the like, only the substrate 11 is left for background correction, and the M-H loop for the substrate 11 is measured in the thickness direction of the substrate 11 (the thickness direction of the magnetic recording medium 10) with the use of a VSM. Thereafter, the M-H loop for the substrate 11 is subtracted from the M-H loop for the entire measurement sample to obtain an M-H loop after the background correction. The coercive force Hc is determined from the obtained M-H loop. Note that the M-H loops are all measured at 25°

C. Furthermore, in measuring the M-H loop in the thickness direction (vertical direction) of the magnetic recording medium 10, no "demagnetizing field correction" is performed.

(Ratio R between Coercive Force Hc (50) and Coercive Force Hc (25))

The ratio R between the coercive force Hc (50) measured in the thickness direction (vertical direction) of the magnetic recording medium 10 at 50° C. and the coercive force Hc (25) measured in the thickness direction of the magnetic recording medium 10 at 25° C. (=(Hc (50)/Hc (25))×100) is preferably 95% or more, more preferably 96% or more, still more preferably 97% or more, particularly preferably 98% or more. When the ratio R mentioned above is 95% or more, the temperature dependency of the coercive force Hc is reduced, thereby making it possible to keep the SNR under a high-temperature environment from being degraded.

The above-mentioned coercive force Hc (25) is determined in a similar manner to the above-mentioned method of measuring the coercive force Hc. Furthermore, the above-mentioned coercive force Hc (50) is determined in a similar manner to the above-mentioned method of measuring the coercive force Hc, except that the M-H loops for the measurement sample and the substrate 11 are both measured at 50° C.

(Squareness Ratio S1 measured in Running Direction)

The squareness ratio S1 measured in the running direction of the magnetic recording medium 10 is preferably 35% or less, more preferably 27% or less, still more preferably 20% or less. When the squareness ratio S1 is 35% or less, the vertical orientation of the magnetic powder is sufficiently increased, thus allowing a better SNR to be achieved. Accordingly, better electromagnetic conversion characteristics can be obtained. Furthermore, the shape of the servo signal is improved, thereby making it easier to control the drive side.

The above-mentioned squareness ratio S1 is determined as follows. First, a measurement sample is cut out from the elongated magnetic recording medium 10, and the M-H loop for the entire measurement sample, corresponding to the running direction (longitudinal direction) of the magnetic recording medium 10, is measured with the use of a VSM. Next, the coating film (the base layer 12, the recording layer 13, and the like) is wiped with the use of acetone, ethanol, or the like, thereby leaving only the substrate 11 for background correction, and with the use of a VSM, the M-H loop for the substrate 11 is measured which corresponds to the running direction of the substrate 11 (the running direction of the (magnetic recording medium 10). Thereafter, the M-H loop for the substrate 11 is subtracted from the M-H loop for the entire measurement sample to obtain an M-H loop after the background correction. The squareness ratio S1(%) is calculated by substituting the saturation magnetization Ms (emu) and remanent magnetization Mr (emu) of the obtained M-H loop into the following formula. Note that the M-H loops are all measured at 25° C.

Squareness Ratio $S1(\%)=(Mr/Ms)\times 100$ (Squareness Ratio S2 measured in Vertical Direction)

The squareness ratio S2 measured in the vertical direction (thickness direction) of the magnetic recording medium 10 is preferably 65% or more, more preferably 73% or more, and still more preferably 80% or more. When the squareness ratio S2 is 65% or more, the vertical orientation of the magnetic powder is sufficiently increased, thus allowing a better SNR to be achieved. Accordingly, better electromagnetic conversion characteristics can be obtained. Furthermore, the shape of the servo signal is improved, thereby making it easier to control the drive side.

The squareness ratio S2 is determined in a similar manner to the squareness ratio S1, except that the M-H loops are measured in the vertical direction (thickness direction) of the magnetic recording medium 10 and substrate 11. Note that in the measurement of the squareness ratio S2, no "demagnetizing field correction" is performed in measuring the M-H loop in the vertical direction of the magnetic recording medium 10.

The squareness ratios S1 and S2 are set to a desired value by adjusting, for example, the strength of the magnetic field applied to a paint for recording layer formation, the time of applying a magnetic field to the paint for recording layer formation, the dispersion state of the magnetic powder in the paint for recording layer formation, the concentration of the solid content in the paint for recording layer formation, or the like. Specifically, for example, as the strength of the magnetic field is increased, the squareness ratio S1 is decreased, whereas the squareness ratio S2 is increased. Furthermore, as the time of applying the magnetic field is made longer, the squareness ratio S1 is decreased, whereas the squareness ratio S2 is increased. Furthermore, as the dispersion state of the magnetic powder is improved, the squareness ratio S1 is decreased, whereas the squareness ratio S2 is increased. Furthermore, as the concentration of the solid content is reduced, the squareness ratio S1 is decreased, whereas the squareness ratio S2 is increased. Note that the adjustment methods mentioned above may be used alone, or two or more thereof may be used in combination.

(SFD)

Figure 4:
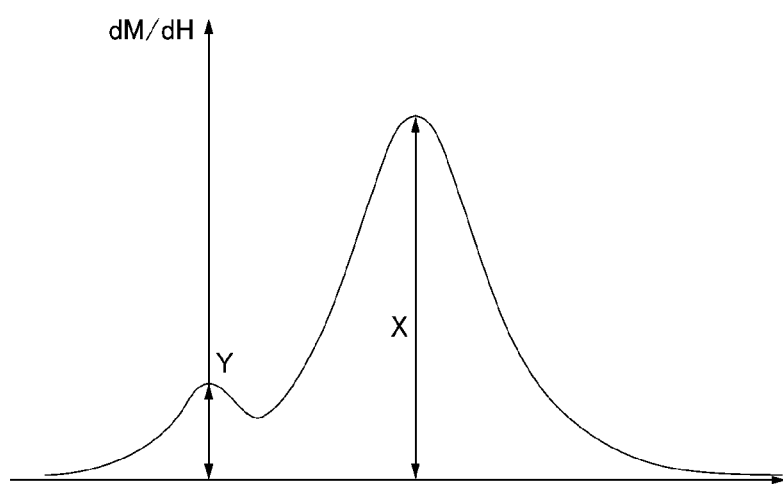
FIG. 4 is a graph showing an example of an SFD curve.

In the switching field distribution (SFD) curve of the magnetic recording medium 10, the peak ratio X/Y of a main peak height X to a sub-peak height Y near the zero magnetic field is preferably 3.0 or more, more preferably 5.0 or more, still more preferably 7.0 or more, particularly preferably 10.0 or more, most preferably 20.0 or more (see FIG. 4). When the peak ratio X/Y is 3.0 or more, a lot of low coercive force components unique to ε-iron oxide (for example, soft magnetic particles, superparamagnetic particles, and the like) can be kept from being included in the magnetic powder in addition to the ε-iron oxide particles which contribute to actual recording. Thus, the leakage magnetic field from the recording head can keep the magnetization signal recorded on the adjacent track from being degraded, thus achieving a better SNR. The upper limit value of the peak ratio X/Y is not particularly limited but is, for example, 100 or less.

The above-mentioned peak ratio X/Y is determined as follows. First, an M-H loop after background correction is obtained in a similar manner to the above-mentioned method of measuring the coercive force Hc. Next, an SFD curve is calculated from the obtained M-H loop. For the calculation of the SFD curve, the program attached to the measuring machine may be used, or other programs may be used. The peak ratio X/Y is calculated with the absolute value of the point where the calculated SFD curve crosses the Y axis (dM/dH) as "Y", and the height of the main peak observed near the coercive force Hc in the M-H loop as "X". Note that the M-H loop is measured at 25° C. in a similar manner to the above-mentioned method of measuring the coercive force Hc. Furthermore, in measuring the M-H loop in the thickness direction (vertical direction) of the magnetic recording medium 10, no "demagnetizing field correction" is performed.

(Activation Volume $V_{act}$)

The activation volume $V_{act}$ is preferably 8000 nm³ or less, more preferably 6000 nm³ or less, still more preferably 5000 nm³ or less, particularly preferably 4000 nm³ or less, most preferably 3000 nm³ or less. When the activation volume $V_{act}$ is 8000 nm³ or less, the favorable dispersion state of the magnetic powder can thus make the bit inversion region steep, and the leakage magnetic field from the recording head can keep the magnetization signal recorded on the adjacent track from being degraded. Thus, there is a possibility that a better SNR will not be achieved.

The above-mentioned activation volume $V_{act}$ is determined by the following equation derived by Street & Woolley.

$$V_{act}(nm^3) = k_B \times T \times X_{irr}/(\mu_0 \times Ms \times S)$$

($k_B$: Boltzmann's constant ($1.38 \times 10^{-23}$ J/K), T: temperature (K), $X_{irr}$: irreversible susceptibility, $\mu_0$: permeability of vacuum, S: magnetic viscosity coefficient, Ms: saturation magnetization (emu/cm³))

The irreversible susceptibility $X_{irr}$, the saturation magnetization Ms, and the magnetic viscosity coefficient S to be substituted in the above-mentioned formula are determined in the following way with the use of a VSM. Note that the measurement direction with the VSM is assumed to be the thickness direction (vertical direction) of the magnetic recording medium 10. Furthermore, the measurement with the VSM is made at 25° C. for the measurement sample cut out from the elongated magnetic recording medium 10. Furthermore, in measuring the M-H loop in the thickness direction (vertical direction) of the magnetic recording medium 10, no "demagnetizing field correction" is performed.

(Irreversible Susceptibility $X_{irr}$)

The irreversible susceptibility $X_{irr}$ is defined as a slope in the vicinity of a remanent coercive force Hr at the slope of a remanent magnetization curve (DCD curve). First, a magnetic field of −1193 kA/m (15 kOe) is applied to the entire magnetic recording medium 10, and the magnetic field is returned to zero to provide a remanent magnetization state. Thereafter, a magnetic field of about 15.9 kA/m (200 Oe) is applied in the opposite direction, and returned to zero again, and the remanent magnetization amount is measured. Thereafter, similarly, the measurement of applying a magnetic field that is 15.9 kA/m larger than the previously applied magnetic field and returning the magnetic field to zero is repeatedly made, thereby plotting the remanent magnetization amount with respect to the applied magnetic field, and then measuring a DCD curve. From the obtained DCD curve, the point at which the magnetization amount is zero is regarded as the remanent coercive force Hr, and the DCD curve is further differentiated, thereby determining the slope of the DCD curve at each magnetic field. At the slope of this DCD curve, the slope in the vicinity of the remanent coercive force Hr is referred to as $X_{irr}$.

(Saturation Magnetization Ms)

First, a M-H loop for the entire magnetic recording medium 10 (measurement sample) is measured in the thickness direction of the magnetic recording medium 10. Next, the coating film (the base layer 12, the recording layer 13, and the like) is wiped with the use of acetone, ethanol, and the like, thereby leaving only the substrate 11 for background correction, and the M-H loop for the substrate 11 is measured similarly in the thickness direction. Thereafter, the M-H loop for the substrate 11 is subtracted from the M-H loop for the entire magnetic recording medium 10 to obtain an M-H loop after the background correction. Ms (emu/cm³) is calculated from the value of the saturation magnetization Ms (emu) of the obtained M-H loop and the volume (cm³) of the recording layer 13 in the measurement sample. Note that the volume of the recording layer 13 is determined by multiplying the area of the measurement sample by the average thickness of the recording layer 13. The method of calculating the average thickness of the recording layer 13, required for calculating the volume of the recording layer 13, will be described later.

(Magnetic Viscosity Coefficient S)

First, a magnetic field of −1193 kA/m (15 kOe) is applied to the entire magnetic recording medium 10 (measurement sample), and the magnetic field is returned to zero to provide a remanent magnetization state. Thereafter, a magnetic field that is equivalent to the value of the remanent coercive force Hr obtained from the DCD curve is applied in the opposite direction. The magnetization amount is continuously measured at regular time intervals for 1000 seconds with the magnetic field applied. The magnetic viscosity coefficient S is calculated by checking the thus obtained relation between the time t and the magnetization amount M(t) from the following formula.

$$M(t) = M0 + S \times \ln(t)$$

(M(t): magnetization amount at time t, M0: initial magnetization amount, S: magnetic viscosity coefficient, ln(t): natural logarithm of time)

(Arithmetic Mean Roughness Ra)

The arithmetic mean roughness Ra of the magnetic surface is preferably 2.5 nm or less, more preferably 2.0 nm or less. When Ra is 2.5 nm or less, a better SNR can be obtained.

The arithmetic mean roughness Ra mentioned above is determined as follows. First, the surface on the side with the recording layer 13 provided is observed with the use of an atomic force microscope (AFM) (manufactured by Bruker, Dimension Icon), thereby acquiring a cross-sectional profile. Next, the arithmetic mean roughness Ra is determined from the obtained cross-sectional profile in accordance with JIS B0601: 2001.

[Method for Producing Magnetic Recording Medium]

Next, a method for producing the magnetic recording medium 10 which has the configuration described above will be described. First, a paint for base layer formation is prepared by kneading and dispersing a nonmagnetic powder and a binder, etc. in a solvent. Next, a paint for recording layer formation is prepared by kneading and dispersing a magnetic powder and a binder, etc. in a solvent. For the preparation of the paint for recording layer formation and the paint for base layer formation, for example, the following solvents, dispersing devices, and kneading devices can be used.

Examples of the solvent for use in the preparation of the above-described paint preparation include, for example, ketone solvents such as acetone, methyl ethyl ketone, methyl isobutyl ketone, and cyclohexanone, alcohol solvents such as methanol, ethanol, and propanol, ester solvents such as methyl acetate, ethyl acetate, butyl acetate, propyl acetate, ethyl lactate, and ethylene glycol acetate, ether solvents such as diethylene glycol dimethyl ether, 2-ethoxyethanol, tetrahydrofuran, and dioxane, aromatic hydrocarbon solvents such as benzene, toluene, and xylene, and halogenated hydrocarbon solvents such as methylene chloride, ethylene chloride, carbon tetrachloride, chloroform, and chlorobenzene, and the like. These solvents may be used alone, or used appropriately in mixture.

For example, kneading devices such as a continuous twin-screw kneader, a continuous twin-screw kneader capable of diluting in multiple stages, a kneader, a pressure kneader, and a roll kneader can be used as the kneading device for use in the above-described paint preparation, which is not to be considered particularly limited to the foregoing devices. Furthermore, for example, dispersing devices such as a roll mill, a ball mill, a horizontal sand mill, a vertical sand mill, a spike mill, a pin mill, a tower mill, a pearl mill (for example, a "DCP mill" manufactured by Eirich, or the like), a homogenizer, and an ultrasonic dispersing machine can be used as the dispersing device for use in the above-described paint preparation, which is not to be considered particularly limited to the foregoing devices.

Next, the paint for base layer formation is applied to one main surface of the substrate 11, and dried, thereby forming the base layer 12. Subsequently, the paint for recording layer formation is applied onto the base layer 12, and dried, thereby forming the recording layer 13 on the base layer 12. Note that in the drying, the magnetic powder is magnetically oriented in the thickness direction of the substrate 11 by, for example, a solenoidal coil. Furthermore, in the drying, the magnetic powder may be magnetically oriented in the thickness direction of the substrate 11 after magnetically orienting the magnetic powder in the running direction (longitudinal direction) of the substrate 11 by, for example, a solenoidal coil. After the formation of the recording layer 13, the back layer 14 is formed on the other main surface of the substrate 11. Thus, the magnetic recording medium 10 is obtained.

Thereafter, the obtained magnetic recording medium 10 is rewound around the large-diameter core, and subjected to a hardening treatment. Finally, the magnetic recording medium 10 is subjected to a calendering treatment, and then cut into a predetermined width (for example, ½-inch width). The intended long elongated magnetic recording medium 10 is obtained in accordance with the foregoing.

[Configuration of Recording/Reproducing Device]

Next, the configuration of a recording/reproducing device 30 for recording and reproducing on and from the magnetic recording medium 10 which has the above-described configuration will be described with reference to FIG. 5.

The recording/reproducing device 30 has a configuration capable of adjusting the tension applied in the longitudinal direction of the magnetic recording medium 10. Furthermore, the recording/reproducing device 30 has a configuration capable of loading a magnetic recording medium cartridge 10A. Here, for the sake of easy-to-follow explanation, a case where the recording/reproducing device 30 has a configuration capable of loading one magnetic recording medium cartridge 10A will be described, but the recording/reproducing device 30 may have a configuration capable of loading a plurality of magnetic recording medium cartridges 10A.

The recording/reproducing device 30 is connected to information processing devices such as servers 41 and personal computers (hereinafter referred to as "PCs") 42 via a network 43, and configured to be capable of recording data supplied from the information processing devices on the magnetic recording medium cartridge 10A. The shortest recording wavelength of the recording/reproducing device 30 is preferably 100 nm or less, more preferably 75 nm or less, still more preferably 60 nm or less, particularly preferably 50 nm or less.

Figure 5:
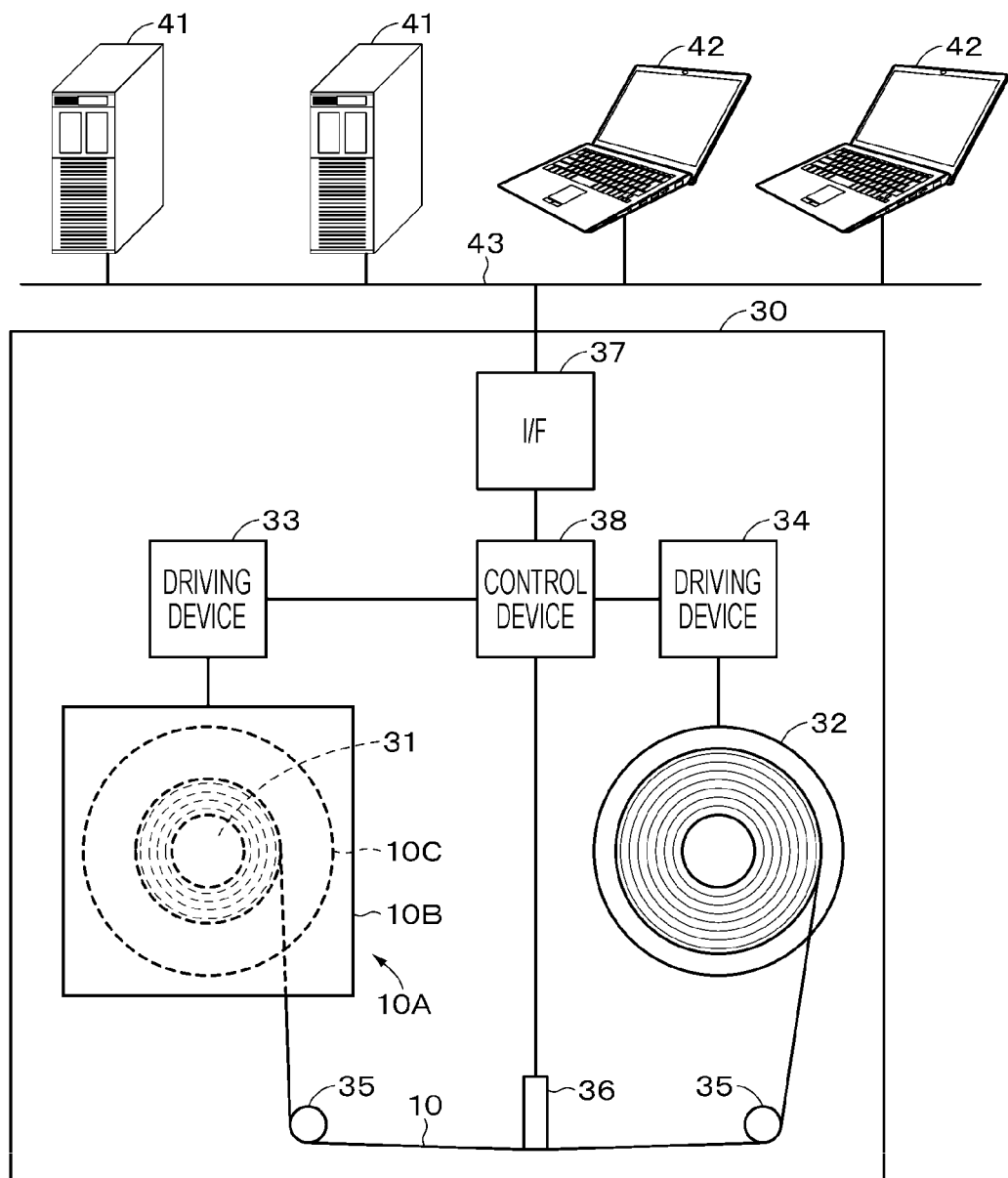
FIG. 5 is a schematic diagram illustrating the configuration of a recording/reproducing device.

The recording/reproducing device includes, as shown in FIG. 5, a spindle 31, a reel 32 on the recording/reproducing device side, a spindle driving device 33, a reel driving device 34, a plurality of guide rollers 35, a head unit 36, a communication interface (hereinafter referred to as an I/F) 37, and a control device 38.

The spindle 31 is configured to be capable of mounting the magnetic recording medium cartridge 10A. The magnetic recording medium cartridge 10A in conformity with the linear tape open (LTO) standard rotatably houses, in a cartridge case 10B, a single reel 10C with the magnetic recording medium 10 wound. On the magnetic recording medium 10, a servo pattern in an inverted V shape is recorded in advance as a servo signal. The reel 32 is configured to be capable of fixing the leading end of the magnetic recording medium 10 drawn out from the magnetic recording medium cartridge 10A.

The spindle driving device 33 is a device that rotationally drives the spindle 31. The reel driving device 34 is a device that rotationally drives the reel 32. In recording or reproducing data on the magnetic recording medium 10, the spindle driving device 33 and the reel driving device 34 rotationally drive the spindle 31 and the reel 32 to run the magnetic recording medium 10. The guide roller 35 is a roller for guiding the running of the magnetic recording medium 10.

The head unit 36 includes a plurality of recording heads for recording data signals on the magnetic recording medium 10, a plurality of reproducing heads for reproducing data signals recorded on the magnetic recording medium 10, and a plurality of servo heads for reproducing servo signals recorded on the magnetic recording medium 10. As the recording heads, for example, ring-type heads can be used, but the type of the recording heads is not limited thereto.

The communication I/F 37 is indented for communicating with the information processing devices such as the servers 41 and the PCs 42, and connected to the network 43.

The control device 38 controls the while recording/reproducing device 30. For example, in response to a request from the information processing device such as the servers 41 and the PCs 42, the control device 38 records, by the head unit 36, the data signal supplied from the information processing device on the magnetic recording medium 10. Furthermore, in response to a request from the information processing device such as the servers 41 and the PCs 42, the control device 38 reproduces the data signal recorded on the magnetic recording medium 10 by the head unit 36, and supplies the data signal to the information processing device.

Furthermore, the control device 38 detects a change in the width of the magnetic recording medium 10, on the basis of the servo signal supplied from the head unit 36. Specifically, the magnetic recording medium 10 has a plurality of inverted V-shaped servo patterns recorded thereon as servo signals, and the head unit 36 can simultaneously reproduce two different servo patterns by the two servo heads on the head unit 36, thereby providing respective servo signals. With the use of relative position information between the servo patterns and the head unit obtained from the servo signals, the position of the head unit 36 is controlled so as to follow the servo patterns. At the same time, distance information between the servo patterns can also be obtained by comparing the two servo signal waveforms. The change in the distance between the servo patterns for each measurement can be obtained by comparing the distance information between the servo patterns, obtained for each measurement. By adding thereto distance information between the servo patterns at the time of servo pattern recording, the change in the width of the magnetic recording medium 10 can also be calculated. The control device 38 controls the rotational driving of the spindle driving device 33 and reel driving device 34, on the basis of the change in the distance between the servo patterns, obtained in the way described above, or the change in the calculated width of the magnetic recording medium 10, thereby adjusting the tension in the longitudinal direction of the magnetic recording medium 10 such that the width of the magnetic recording medium 10 has a prescribed width or a substantially prescribed width. Accordingly, the change in the width of the magnetic recording medium 10 can be reduced.

[Operation of Recording/Reproducing Device]

Next, the operation of the recording/reproducing device 30 which has the above-mentioned configuration will be described.

First, the magnetic recording medium cartridge 10A is mounted on the recording/reproducing device 30, the leading end of the magnetic recording medium 10 is drawn out, transferred to the reel 32 via the plurality of guide rollers 35 and the head unit 36, and the leading end of the magnetic recording medium 10 is attached to the reel 32.

Next, when an operation unit, not shown, is operated, the spindle driving device 33 and the reel driving device 34 are driven under the control of the control device 38, thereby rotating the spindle 31 and the reel 32 in the same direction such that the magnetic recording medium 10 runs from the reel 10C toward the reel 32. Thus, while taking up the magnetic recording medium 10 on the reel 32, the head unit 36 records information on the magnetic recording medium 10 or reproduces information recorded on the magnetic recording medium 10.

Furthermore, in the case of rewinding the magnetic recording medium 10 onto the reel 10C, the spindle 31 and the reel 32 are rotationally driven in the opposite direction to the direction mentioned above, thereby causing the magnetic recording medium 10 to run from the reel 32 to the reel 10C. Also in this rewinding, the head unit 36 records information on the magnetic recording medium 10 or reproduces information recorded on the magnetic recording medium 10.

Advantageous Effect

For the magnetic recording medium 10 according to the first embodiment, the average thickness $t_T$ of the magnetic recording medium 10 meets the requirement that $t_T \leq 5.5$ [μm], and the dimensional change amount $\Delta w$ in the width direction of the magnetic recording medium 10 meets the requirement that 700 [ppm/N]$\leq \Delta w$ with respect to the tension change in the longitudinal direction of the magnetic recording medium 10. Thus, even if there are changes in temperature and humidity, the width change of the magnetic recording medium 10 can be reduced by adjusting the tension in the longitudinal direction of the magnetic recording medium 10 with the recording/reproducing device. Accordingly, the width of the magnetic recording medium 10 can be kept constant or substantially constant.

MODIFICATION EXAMPLES

Modification Example 1

Figure 6:
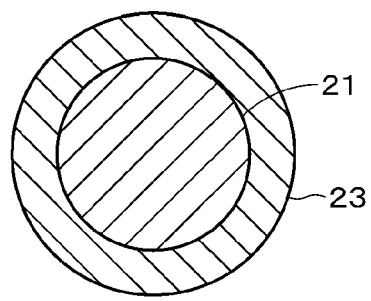
FIG. 6 is a cross-sectional view illustrating the configuration of a magnetic particle according to a modification example.

In the first embodiment described above, a case where the ε-iron oxide particles have the shell part 22 that has a two-layer structure has been described, but as shown in FIG. 6, the ε-iron oxide particle may have a shell part 23 that has a single-layer structure. In this case, the shell part 23 has a similar configuration to the first shell part 22a. From the viewpoint of suppressing characteristic deterioration of the ε-iron oxide particles, however, the ε-iron oxide particles preferably have the shell part 22 that has a two-layer structure, as in the above-described embodiment.

Modification Example 2

In the first embodiment described above, a case where the ε-iron oxide particles have the core-shell structure has been described, but the ε-iron oxide particles may include an additive instead of the core-shell structure, or have the core-shell structure and also include an additive. In this case, Fe of the ε-iron oxide particle is partially substituted with the additive. The ε-iron oxide particles include an additive, thereby also allowing the coercive force Hc of the ε-iron oxide particles as a whole to be adjusted to the coercive force Hc suitable for recording, and thus the ease of recording to be improved. The additive is a metal element other than iron, preferably a trivalent metal element, more preferably one or more metal elements selected from the group consisting of aluminum (Al), gallium (Ga), and indium (In).

Specifically, the ε-iron oxide including the additive is an ε-$Fe_{2-x}M_xO_3$ crystal (where M represents a metal element other than iron, preferably a trivalent metal element, more preferably one or more metal elements selected from the group consisting of Al, Ga, and In. x represents, for example, $0 \leq x \leq 1$).

Modification Example 3

The magnetic powder may be a barium ferrite magnetic powder. The barium ferrite magnetic powder includes magnetic particles of an iron oxide containing, as its main phase, barium ferrite (hereinafter referred to as "barium ferrite particles").

The average particle size of the barium ferrite magnetic powder is 50 nm or less, more preferably 10 nm or more and 40 nm or less, still more preferably 15 nm or more and 30 nm or less.

In a case where the recording layer 13 includes the barium ferrite magnetic powder as the magnetic powder, the average thickness $t_m$ of the recording layer 13 preferably meets the requirement that 35 [nm]$\leq t_m \leq$100 [nm]. Furthermore, the coercive force Hc measured in the thickness direction (perpendicular direction) of the magnetic recording medium 10 is preferably 160 kA/m or more and 280 kA/m or less, more preferably 165 kA/m or more and 275 kA/m or less, still more preferably 170 kA/m or more and 270 kA/m or less. Note that the squareness ratio S1 measured in the running direction and the squareness ratio S2 measured in the vertical direction are similar to those in the first embodiment.

Modification Example 4

The magnetic powder may be a cobalt ferrite magnetic powder. The cobalt ferrite magnetic powder includes magnetic particles of an iron oxide containing, as its main phase, cobalt ferrite (hereinafter referred to as "cobalt ferrite magnetic particles"). The cobalt ferrite magnetic particles preferably have uniaxial anisotropy. The cobalt ferrite magnetic particles have, for example, a cubic shape or a substantially cubic shape. Cobalt ferrite refers to cobalt ferrite containing Co. In addition to Co, the cobalt ferrite may further contain one or more elements selected from the group consisting of Ni, Mn, Al, Cu, and Zn.

The cobalt ferrite has, for example, an average composition represented by the following formula (1).

$$Co_xM_yFe_2O_Z \quad (1)$$

(In the formula (1), M represents one or more metals selected from the group consisting of Ni, Mn, Al, Cu, and Zn, for example. x represents a value within the range of $0.4 \leq x \leq 1.0$. y represents a value within the range of $0 \leq y \leq 0.3$. However, x and y satisfy the relation of $(x+y) \leq 1.0$. z represents a value within the range of $3 \leq z \leq 4$. Fe may be partially substituted with another metal element.)

The average particle size of the cobalt ferrite magnetic powder is preferably 25 nm or less, more preferably 23 nm or less. The coercive force Hc of the cobalt ferrite magnetic powder is preferably 2500 Oe or more, more preferably 2600 Oe or more and 3500 Oe or less. Note that the squareness ratio S1 measured in the running direction and the squareness ratio S2 measured in the vertical direction are similar to those in the first embodiment.

Modification Example 5

Figure 7:
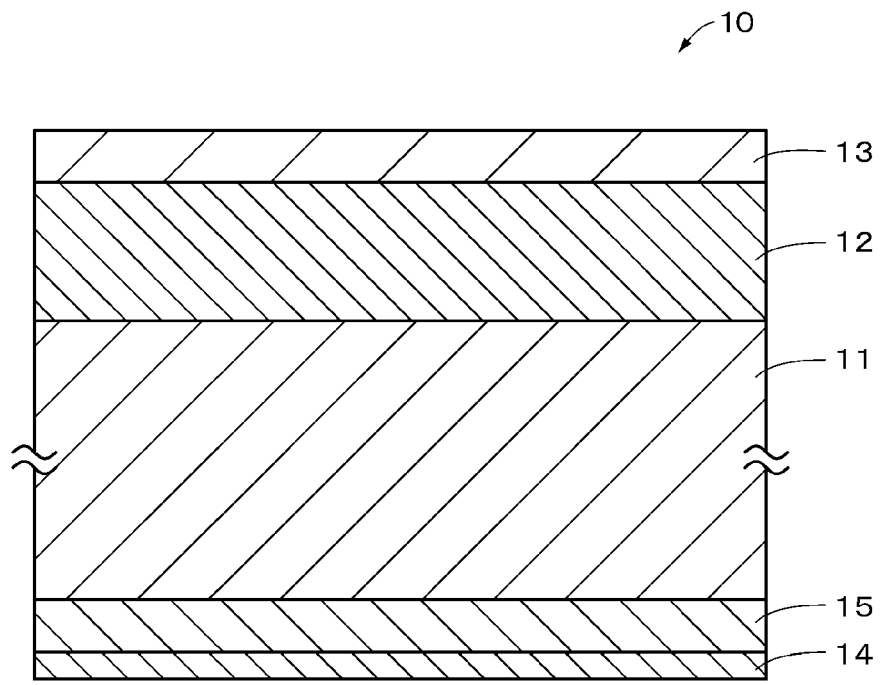
FIG. 7 is a cross-sectional view illustrating the configuration of a magnetic recording medium according to a modification example.

As shown in FIG. 7, the magnetic recording medium 10 may further include a barrier layer 15 provided on at least one surface of the substrate 11. The barrier layer 15 is a layer for reducing the dimensional change depending on the environment of the substrate 11. For example, as a cause example of the dimensional change, the substrate 11 is hygroscopic. In such a case, the ingress speed of moisture into the substrate 11 can be reduced by the barrier layer 15. The barrier layer 15 includes a metal or a metal oxide. As the metal, for example, at least one of Al, Cu, Co, Mg, Si, Ti, V, Cr, Mn, Fe, Ni, Zn, Ga, Ge, Y, Zr, Mo, Ru, Pd, Ag, Ba, Pt, Au, or Ta can be used. As the metal oxide, for example, at least one of $Al_2O_3$, CuO, CoO, $SiO_2$, $Cr_2O_3$, $TiO_2$, $Ta_2O_5$, or $ZrO_2$ can be used, and any of oxides of the above-mentioned metals can be also used. Furthermore, diamond-like carbon (DLC), diamond, or the like can be also used.

The average thickness of the barrier layer 15 is preferably 20 nm or more and 1000 nm or less, more preferably 50 nm or more and 1000 nm or less. The average thickness of the barrier layer 15 is determined in a similar manner to the average thickness $t_m$ of the recording layer 13. The magnification of the TEM image is, however, adjusted appropriately in accordance with the thickness of the barrier layer 15.

Modification Example 6

The magnetic recording medium 10 may be used for a library device. In this case, the library device has a configuration capable of adjusting the tension applied in the longitudinal direction of the magnetic recording medium 10, and may include a plurality of recording/reproducing devices 30 according to the first embodiment.

Modification Example 7

The magnetic recording medium 10 may be used as a servo writer. In other words, the servo writer may adjust the tension in the longitudinal direction of the magnetic recording medium 10 at the time of servo signal recording or the like, thereby keeping the width of the magnetic recording medium 10 constant or substantially constant. In this case, the servo writer may include a detection device that detects the width of the magnetic recording medium 10, so as to adjust, on the basis of the detection result of the detection device, the tension in the longitudinal direction of the magnetic recording medium 10.

Modification Example 8

The magnetic recording medium 10 is not to be considered limited to a vertical recording-type magnetic recording medium, and may be a horizontal recording-type magnetic recording medium. In this case, an acicular magnetic powder such as a metal magnetic powder may be used as the magnetic powder.

Modification Example 9

Instead of the powder of ε-iron oxide particles, the magnetic powder may include a powder of hexagonal ferrite-containing nanoparticles (hereinafter referred to as "hexagonal ferrite particles"). The hexagonal ferrite particles have, for example, a hexagonal plate shape or a substantially hexagonal plate shape. The hexagonal ferrite preferably contains at least one of Ba, Sr, Pb, or Ca, more preferably at least one of Ba or Sr. Specifically, the hexagonal ferrite may be, for example, barium ferrite or strontium ferrite. The barium ferrite may further contain at least one of Sr, Pb, or Ca in addition to Ba. The strontium ferrite may further contain at least one of Ba, Pb, or Ca in addition to Sr.

More specifically, the hexagonal ferrite has an average composition represented by the general formula $MFe_{12}O_{19}$. However, M is, for example, at least one metal of Ba, Sr, Pb, or Ca, preferably at least one metal of Ba or Sr. M may be a combination of Ba and one or more metals selected from the group consisting of Sr, Pb, and Ca. Furthermore, M may be a combination of Sr and one or more metals selected from the group consisting of Ba, Pb, and Ca. In the general formula mentioned above, Fe may be partially substituted with another metal element.

In a case where the magnetic powder includes a powder of hexagonal ferrite particles, the average particle size of the magnetic powder is preferably 50 nm or less, more preferably 10 nm or more and 40 nm or less, still more preferably 15 nm or more and 30 nm or less. Note that the squareness ratio S1 measured in the running direction and the squareness ratio S2 measured in the vertical direction are similar to those in the first embodiment.

2 Second Embodiment

[Configuration of Magnetic Recording Medium]

Figure 8:
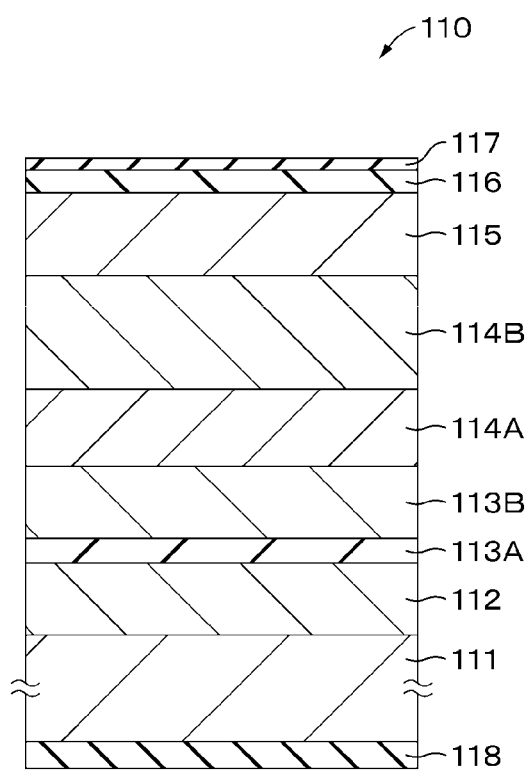
FIG. 8 is a cross-sectional view illustrating the configuration of a magnetic recording medium according to a second embodiment.

A magnetic recording medium 110 according to the second embodiment is an elongated perpendicular magnetic recording medium, which includes, as shown in FIG. 8, a film-shaped substrate 111, a soft magnetic base layer (hereinafter referred to as "SUL") 112, a first seed layer 113A, a second seed layer 113B, a first base layer 114A, a second base layer 114B, and a recording layer 115. The SUL 112, the first and second seed layers 113A and 113B, the first and second base layers 114A and 114B, and the recording layer 115 are, for example, vacuum thin films such as sputtered layers.

The SUL 112, the first and second seed layers 113A and 113B, and the first and second base layers 114A and 114B are disposed between one main surface (hereinafter referred to as a "surface") of the substrate 111 and the recording layer 115, and the SUL 112, the first seed layer 113A, the second seed layer 113B, the first base layer 114A, and the second base layer 114B are stacked in this order from the substrate 111 toward the recording layer 115.

If necessary, the magnetic recording medium 110 may further include a protective layer 116 provided on the recording layer 115 and a lubricating layer 117 provided on the protective layer 116. Furthermore, the magnetic recording medium 110 may further include a back layer 118 provided on the other main surface (hereinafter referred to as a "back surface") of the substrate 111, if necessary.

Hereinafter, the longitudinal direction of the magnetic recording medium 110 (the longitudinal direction of the substrate 111) is referred to as a machine direction (MD) direction. Here, the machine direction means the relative movement direction of the recording and reproducing heads with respect to the magnetic recording medium 110, that is, the direction in which the magnetic recording medium 110 runs at the time of recording/reproducing.

The magnetic recording medium 110 according to the second embodiment is suitable for use as a storage medium for data archive, which is expected to be demanded increasingly in the future. This magnetic recording medium 110 is capable of achieving, for example, a surface recording density that is ten times or more as high as that of a current coating-type magnetic recording medium for storage, that is, a surface recording density of 50 Gb/in$^2$ or more. In a case where a common linear-recording data cartridge is configured with the use of the magnetic recording medium 110 which has such a surface recording density, it is possible to record a large capacity of 100 TB or more per data cartridge.

The magnetic recording medium 110 according to the second embodiment is suitable for use in a recording/reproducing device (recording/reproducing device for recording and reproducing data) including a ring-type recording head and a giant magnetoresistive (GMR) type or a tunneling magnetoresistive (TMR) type reproducing head. Furthermore, for the magnetic recording medium 110 according to the second embodiment, a ring-type recording head is preferably used as a servo-signal writing head. On the recording layer 115, a data signal is vertically recorded by, for example, a ring-type recording head. Furthermore, on the recording layer 115, a servo signal is perpendicularly recorded by, for example, a ring-type recording head.

The average thickness $t_T$, dimensional change amount $\Delta w$, temperature expansion coefficient $\alpha$, humidity expansion coefficient $\beta$, Poisson's ratio $\rho$, and longitudinal elastic limit $\sigma_{MD}$ of the magnetic recording medium 110, the average thickness $t_b$ of the back layer 118, the surface roughness $R_b$ of the back layer 118, the interlayer friction coefficient $\mu$ between the magnetic surface and the back surface, and the like are similar to those in the first embodiment.

(Substrate)

The substrate 111 is similar to the substrate 11 according to the first embodiment.

(SUL)

The SUL 112 includes a soft magnetic material in an amorphous state. The soft magnetic material includes, for example, at least one of a Co-based material or an Fe-based material. The Co-based material contains, for example, CoZrNb, CoZrTa, or CoZrTaNb. The Fe-based material contains, for example, FeCoB, FeCoZr, or FeCoTa.

The SUL 112 is a single-layer SUL, and provided directly on the substrate 111. The average thickness of the SUL 112 is preferably 10 nm or more and 50 nm or less, and more preferably 20 nm or more and 30 nm or less.

The average thickness of the SUL 112 is determined in a similar manner to the recording layer 13 according to the first embodiment. Note that the average thicknesses of the layers other than the SUL 112 (that is, the average thicknesses of the first and second seed layers 113A and 113B, first and second underlayers 114A and 114B, and recording layer 115) as described later, are determined in a similar manner to the recording layer 13 according to the first embodiment. The magnification of the TEM image is, however, adjusted appropriately depending on the thickness of each layer.

(First and Second Seed Layers)

The first seed layer 113A includes an alloy containing Ti and Cr, and has an amorphous state. Furthermore, this alloy may further contain therein O (oxygen). This oxygen may be impurity oxygen contained in a small amount in the first seed layer 113A in deposition of the first seed layer 113A by a deposition method such as a sputtering method.

Here, the term "alloy" means at least one such as a solid solution, a eutectic, and an intermetallic compound containing Ti and Cr. The "amorphous state" means that halo is observed by an X-ray diffraction or electron beam diffraction method or the like, thereby failing to identify a crystal structure.

The atomic ratio of Ti to the total amount of Ti and Cr contained in the first seed layer 113A is preferably in the range of 30 atomic % or more and less than 100 atomic %, more preferably 50 atomic % or more and less than 100 atomic %. When the atomic ratio of Ti is less than 30%, the (100) plane of the body-centered cubic lattice (bcc) structure of Cr will be oriented, and there is a possibility that the first and second base layers 114A and 114B formed on the first seed layer 113A may have an orientation degraded.

The above-mentioned atomic ratio of Ti is determined as follows. A depth profile analysis (depth profile measurement) of the first seed layer 113A by Auger Electron Spectroscopy (hereinafter referred to as "AES") is made while ion-milling the magnetic recording medium 110 from the side of the recording layer 115. Next, the average composition (average atomic ratio) of Ti and Cr in the film thickness direction is determined from the obtained depth profile. Next, the above-determined atomic ratio of Ti is determined with the use of the obtained average composition of Ti and Cr.

In a case where the first seed layer 113A contains Ti, Cr, and O, the atomic ratio of O to the total amount of Ti, Cr, and O contained in the first seed layer 113A is preferably 15 atomic % or less, more preferably 10 atomic % or less. When the atomic ratio of O exceeds 15 atomic %, the production of TiO$_2$ crystals will affect the formation of crystal nuclei for the first and second base layers 114A and 114B formed on the first seed layer 113A, and there is a possibility that the first and second base layers 114A and 114B may have an orientation degraded. The atomic ratio of O is determined with the use of an analysis method which is similar to that for the above-mentioned atomic ratio of Ti.

The alloy included in the first seed layer 113A may further contain elements other than Ti and Cr as additive elements. Examples of the additive elements include, for example, one or more elements selected from the group consisting of Nb, Ni, Mo, Al, W, and the like.

The average thickness of the first seed layer 113A is preferably 2 nm or more and 15 nm or less, more preferably 3 nm or more and 10 m or less.

The second seed layer 113B contains, for example, NiW or Ta, and has a crystalline state. The average thickness of the second seed layer 113B is preferably 3 nm or more and 20 nm or less, more preferably 5 nm or more and 15 nm or less.

The first and second seed layers 113A and 113B have a crystal structure similar to those of the first and second base layers 114A and 114B, and serve as seed layers that improve the vertical orientation of the first and second base layers 114A and 114B depending on the amorphous state of the first and second seed layers 113A and 113B, but not seed layers provided for the purpose of crystal growth.

(First and Second Base Layers)

The first and second base layers 114A and 114B preferably have a crystal structure similar to that of the recording layer 115. In a case where the recording layer 115 includes a Co-based alloy, the first and second base layers 114A and 114B include a material that has a hexagonal close-packed (hcp) structure similar to that of the Co based alloy, and the c axis is preferably oriented in a direction perpendicular to the film surface (that is, in the film thickness direction). This is because the orientation of the recording layer 115 can be enhanced, and because the lattice constant matching between the second base layer 114B and the recording layer 115 can be made relatively favorable. As the material that has a hexagonal close-packed (hcp) structure, it is preferable to use a material containing Ru, and specifically a Ru simple substance or a Ru alloy is preferred. Examples of the Ru alloy include, for example, Ru alloy oxides such as Ru—$SiO_2$, Ru—$TiO_2$, or Ru—$ZrO_2$.

As described above, similar materials can be used as the materials of the first and second underlying layers 114A and 114B. The intended effect differs, however, for each of the first and second base layers 114A and 114B. Specifically, the second base layer 114B has a film structure that promotes the granular structure of the recording layer 115 which serves as an upper layer on the base layer, and the first base layer 114A has a film structure with high crystal orientation. In order to obtain such a film structure, the conditions for deposition such as sputtering conditions preferably differ for each of the first and second base layers 114A and 114B.

The average thickness of the first base layer 114A is preferably 3 nm or more and 15 nm or less, more preferably 5 nm or more and 10 nm or less. The average thickness of the second base layer 114B is preferably 7 nm or more and 40 nm or less, more preferably 10 nm or more and 25 nm or less.

(Recording Layer)

The recording layer 115 as a magnetic layer is a perpendicular magnetic recording layer in which a magnetic material is vertically oriented. From the viewpoint of improving the recording density, the recording layer 115 is preferably a granular magnetic layer containing a Co-based alloy. This granular magnetic layer includes ferromagnetic crystal particles containing a Co-based alloy and nonmagnetic particle boundaries (nonmagnetic material) that surround the ferromagnetic crystal particles. More specifically, the granular magnetic layer includes columns (columnar crystals) containing a Co-based alloy, and nonmagnetic particle boundaries (for example, oxide such as $SiO_2$) that surround the columns and magnetically separate the column. This structure can constitute the recording layer 115 that has a structure with the respective columns magnetically separated.

The Co-based alloy has a hexagonal close-packed (hcp) structure, and the c axis thereof is oriented in a direction perpendicular to the film surface (film thickness direction). As the Co-based alloy, it is preferable to use a CoCrPt-based alloy containing at least Co, Cr, and Pt. The CoCrPt-based alloy is not to be considered particularly limited, and the CoCrPt alloy may further contain an additive element. Examples of the additive element include, for example, one or more elements selected from the group consisting of Ni, Ta, and the like.

The nonmagnetic particle boundaries that surround the ferromagnetic crystal particles include a nonmagnetic metal material. Here, the metal is considered to encompass semimetal. As the nonmagnetic metal material, for example, at least one of a metal oxide or a metal nitride can be used, and from the viewpoint of keeping the granular structure more stable, it is preferable to use a metal oxide. Examples of the metal oxide include a metal oxide containing at least one or more elements selected from the group consisting of Si, Cr, Co, Al, Ti, Ta, Zr, Ce, Y, Hf, and the like, and a metal oxide containing at least a Si oxide (that is, SiFt) is preferred. Specific examples of the metal oxide include $SiO_2$, $Cr_2O_3$, CoO, $Al_2O_3$, $TiO_2$, $Ta_2O_5$, $ZrO_2$, $HfO_2$, or the like. Examples of the metal nitride include a metal nitride containing at least one or more elements selected from the group consisting of Si, Cr, Co, Al, Ti, Ta, Zr, Ce, Y, Hf and the like. Specific examples of the metal nitride include SiN, TiN, AlN, or the like.

The CoCrPt-based alloy included in the ferromagnetic crystal particles and the Si oxide included in the nonmagnetic particle boundaries have an average composition represented by the following formula (1). This is because a saturation magnetization amount Ms that can curb the influence of the diamagnetic field and ensure a sufficient reproduced output can be achieved, thereby allowing further improvements in the recording and reproducing characteristics to be achieved.

$$(Co_xPt_yCr_{100-x-y})_{100-z}-(SiO_2)_z \quad (1)$$

(In the formula (1), x, y, and z respectively represent values within the range of 69≤X≤75, 10≤y≤16, and 9≤Z≤12.)

Note that the composition mentioned above can be determined as follows. A depth profile analysis of the recording layer 115 by AES is made while ion-milling the magnetic recording medium 110 from the side of the recording layer 115, thereby determining the average composition (average atomic ratio) of Co, Pt, Cr, S1 and O in the thickness direction.

The average thickness $t_m$ of the recording layer 115 preferably meets the requirement that 9 [nm]≤$t_m$≤90 [nm], more preferably 9 [nm]≤$t_m$≤20 [nm], still more preferably 9 [nm]≤$t_m$≤15 [nm]. When the average thickness $t_m$ of the recording layer 13 meets the requirement that 9 [nm]≤$t_m$≤90 [nm], electromagnetic conversion characteristics can be improved.

(Protective Layer)

The protective layer 116 contains, for example, a carbon material or silicon dioxide ($SiO_2$), and preferably includes a carbon material from the viewpoint of the film strength of the protective layer 116. Examples of the carbon material include, for example, graphite, diamond-like carbon (DLC), diamond, or the like.

(Lubricating Layer)

The lubricating layer 117 includes at least one lubricant. The lubricating layer 117 may further include various additives, for example, rust inhibitors, if necessary. The lubricant has at least two carboxyl groups and one ester bond, and contains at least one carboxylic acid compound represented by the following general formula (1). The lubricant may further include a type of lubricant other than the carboxylic acid type compound represented by the following general formula (1). General Formula (1):

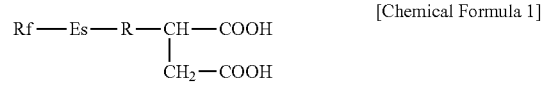

[Chemical Formula 1]

Rf—Es—R—CH—COOH
            |
            CH₂—COOH (In the formula, Rf represents an unsubstituted or substituted, and saturated or unsaturated fluorine-containing hydrocarbon group or hydrocarbon group, Es represents an ester bond, and R, which may be omitted, represents an unsubstituted or substituted, and saturated or unsaturated hydrocarbon group.)

The carboxylic acid compound mentioned above is preferably represented by the following general formula (2) or (3).

General Formula (2):

[Chemical Formula 2]

$$\text{Rf}-\underset{\underset{O}{\|}}{C}-O-\underset{\underset{CH_2-COOH}{|}}{CH}-COOH.$$

(In the formula, Rf represents an unsubstituted or substituted, and saturated or unsaturated fluorine-containing hydrocarbon group or hydrocarbon group.)

General Formula (3):

[Chemical Formula 3]

$$\text{Rf}-\underset{\underset{O}{\|}}{C}-O-CH_2-\underset{\underset{CH_2-COOH}{|}}{CH}-COOH$$

(In the formula, Rf represents an unsubstituted or substituted, and saturated or unsaturated fluorine-containing hydrocarbon group or hydrocarbon group.)

The lubricant preferably includes one or both of the carboxylic acid compounds represented by the general formulas (2) and (3).

When a lubricant including a carboxylic acid compound represented by the general formula (1) is applied to the recording layer 115, the protective layer 116, or the like, a lubricating action is developed by the cohesive force between fluorine-containing hydrocarbon groups or hydrocarbon groups Rf that are hydrophobic groups. In a case where the Rf group is a fluorine-containing hydrocarbon group, the total carbon number is preferably 6 to 50, and the total carbon number of the fluorinated hydrocarbon group is preferably 4 to 20. The Rf group may be saturated or unsaturated, and linear, branched, or cyclic, but is preferably saturated and linear, in particular.

For example, in a case where the Rf group is a hydrocarbon group, the Rf group is desirably a group represented by the following general formula (4).

General Formula (4):

[Chemical Formula 4]

$$CH_3\text{--}(CH_2)_{\overline{l}}$$

(In the general formula (4), l represents an integer selected from the range of 8 to 30, more desirably 12 to 20.)

Furthermore, in a case where the Rf group is a fluorine-containing hydrocarbon group, the Rf group is desirably a group represented by the following general formula (5).

General formula (5):

[Chemical Formula 5]

$$CF_3\text{--}(CF_2)_{\overline{n}}\text{--}(CH_2)_{\overline{m}}$$

(In the general formula (5), m and n each represent an integer selected from the following ranges: m=2 to 20, n=3 to 18, more desirably m=4 to 13, n=3 to 10.)

The fluorinated hydrocarbon group may be concentrated on one site as mentioned above, or dispersed as in the following general formula (6), and may be not only $-CF_3$ or $-CF_2-$, but also $-CHF_2$, $-CHF-$, or the like.

General Formula (6):

[Chemical Formula 6]

$$CF_3\text{--}(CF_2)_{\overline{n1}}\text{--}(CH_2)_{\overline{m1}}\text{--}(CF_2)_{\overline{n2}}\text{--}(CH_2)_{\overline{m2}}$$

(In the general formula (6), n1+n2=n, m1+m2=m.)

The carbon numbers are limited as mentioned above in the general formulas (4), (5), and (6), because when the number of carbon atoms constituting the alkyl group or the fluorine-containing alkyl group (l, or the sum of m and n) is equal to or more than the lower limit mentioned above, the length of the group reaches an appropriate length, thereby effectively exhibiting the cohesive force between the hydrophobic groups, developing a favorable lubricating action, and improving the friction/abrasion durability. Furthermore, this is because when the number of carbon atoms is equal to or less than the upper limit mentioned above, the solubility of the lubricant including the carboxylic acid compound in a solvent is kept favorable.

In particular, the Rf group is, when the group contains a fluorine atom, effective for reduction in friction coefficient, moreover, improvement in running performance, and the like. It is, however, preferable to provide a hydrocarbon group between the fluorine-containing hydrocarbon group and the ester bond, thereby, with the space between the fluorine-containing hydrocarbon group and the ester bond, ensuring the stability of the ester bond for prevention of hydrolysis.

Furthermore, the Rf group may have a fluoroalkyl ether group or a perfluoropolyether group.

The R group may be omitted, but if any, is preferably a hydrocarbon chain having a relatively small number of carbon atoms.

Furthermore, the Rf group or the R group contains, as a constituent element, an element such as nitrogen, oxygen, sulfur, phosphorus, or halogen, and may further have, in addition to the already described functional groups, a hydroxyl group, a carboxyl group, a carbonyl group, an amino group, an ester bond, or the like.

Specifically, the carboxylic acid compound represented by the general formula (1) is preferably at least one of the following compounds. In other words, the lubricant preferably contains at least one of the following compounds.

$CF_3(CF_2)_7(CH_2)_{10}COOCH(COOH)CH_2COOH$
$CF_3(CF_2)_3(CH_2)_{10}COOCH(COOH)CH_2COOH$
$C_{17}H_{35}COOCH(COOH)CH_2COOH$
$CF_3(CF_2)_7(CH_2)_2OCOCH_2CH(C_{18}H_{37})COOCH(COOH)CH_2COOH$
$CF_3(CF_2)_7COOCH(COOH)CH_2COOH$
$CHF_2(CF_2)_7COOCH(COOH)CH_2COOH$
$CF_3(CF_2)_7(CH_2)_2OCOCH_2CH(COOH)CH_2COOH$
$CF_3(CF_2)_7(CH_2)_6OCOCH_2CH(COOH)CH_2COOH$
$CF_3(CF_2)_7(CH_2)_{11}OCOCH_2CH(COOH)CH_2COOH$
$CF_3(CF_2)_3(CH_2)_6OCOCH_2CH(COOH)CH_2COOH$
$C_{18}H_{37}OCOCH_2CH(COOH)CH_2COOH$
$CF_3(CF_2)_7(CH_2)_4COOCH(COOH)CH_2COOH$
$CF_3(CF_2)_3(CH_2)_4COOCH(COOH)CH_2COOH$

CF$_3$(CF$_2$)$_3$(CH$_2$)$_7$COOCH(COOH)CH$_2$COOH
CF$_3$(CF$_2$)$_9$(CH$_2$)$_{10}$COOCH(COOH)CH$_2$COOH
CF$_3$(CF$_2$)$_7$(CH$_2$)$_{12}$COOCH(COOH)CH$_2$COOH
CF$_3$(CF$_2$)$_5$(CH$_2$)$_{10}$COOCH(COOH)CH$_2$COOH
CF$_3$(CF$_2$)$_7$CH(C$_9$H$_{19}$)CH$_2$CH=CH(CH$_2$)$_7$COOCH(COOH)CH$_2$COOH
CF$_3$(CF$_2$)$_7$CH(C$_6$H$_{13}$)(CH$_2$)$_7$COOCH(COOH)CH$_2$COOH
CH$_3$(CH$_2$)$_3$(CH$_2$CH$_2$CH(CH$_2$CH$_2$(CF$_2$)$_9$CF$_3$))$_2$(CH$_2$)$_7$COOCH(COOH)CH$_2$COOH

The carboxylic acid type compound represented by the general formula (1), which is soluble in a non-fluorine solvent which exerts a low burden on the environment, has the advantage of allowing operations such as coating, dipping, and spraying to be performed with the use of a general-purpose solvent such as a hydrocarbon-based solvent, a ketone-based solvent, an alcohol-based solvent, and an ester-based solvent. Specifically, examples can include solvents such as hexane, heptane, octane, decane, dodecane, benzene, toluene, xylene, cyclohexane, methyl ethyl ketone, methyl isobutyl ketone, methanol, ethanol, isopropanol, diethyl ether, tetrahydrofuran, dioxane, and cyclohexanone.

In a case where the protective layer 116 includes a carbon material, when the carboxylic acid compound mentioned above is applied as a lubricant onto the protective layer 116, two carboxyl groups and at least one ester linking group which serve as polar group sites of a lubricant molecule are adsorbed onto the protective layer 116, thereby allowing the cohesive force between the hydrophobic groups to form the lubricating layer 117 which particularly has favorable durability.

Note that the lubricant is not only held as the lubricating layer 117 on the surface of the magnetic recording medium 110 as described above, but also may be included and held in the layers such as the recording layer 115 and the protective layer 116 constituting the magnetic recording medium 110.

(Back Layer)

The back layer 118 is similar to the back layer 14 according to the first embodiment.

[Configuration of Sputtering Apparatus]

An example of the configuration of a sputtering apparatus 120 for use in the manufacture of the magnetic recording medium 110 according to the second embodiment will be described with reference to FIG. 9. This sputtering apparatus 120, which is a continuous winding-type sputtering apparatus for use in deposition of the SUL 112, the first seed layer 113A, the second seed layer 113B, the first base layer 114A, the second base layer 114B, and the recording layer 115, includes, as shown in 9, a deposition chamber 121, a drum 122 which is a metal can (rotating body), cathodes 123a to 123f, a supply reel 124, a take-up reel 125, and a plurality of guide rolls 127a to 127c and 128a to 128c. The sputtering apparatus 120 is, for example, a DC (direct current) magnetron sputtering-type apparatus, but the sputtering type is not limited to the foregoing type.

The deposition chamber 121 is connected to a vacuum pump, not shown, through an exhaust port 126, and the atmosphere in the deposition chamber 121 is set by the vacuum pump to a predetermined degree of vacuum. The drum 122 that has a rotatable configuration, the supply reel 124, and the take-up reel 125 are disposed inside the deposition chamber 121. Inside the deposition chamber 121, the plurality of guide rolls 127a to 127c for guiding the transfer of the substrate 111 between the supply reel 124 and the drum 122 is provided, and the plurality of guide rolls 128a to 128c for guiding the transfer of the substrate 111 between the drum 122 and the take-up reel 125 is provided.

At the time of sputtering, the substrate 111 unwound from the supply reel 124 is wound around the take-up reel 125 via the guide rolls 127a to 127c, the drum 122, and the guide rolls 128a to 128c. The drum 122 has a cylindrical shape, and the elongated substrate 111 is transferred along the peripheral cylindrical surface of the drum 122. The drum 122 is provided with a cooling mechanism, not shown, and cooled to, for example, about −20° C. at the time of sputtering. Inside the deposition chamber 121, the plurality of cathodes 123a to 123f is disposed to face the peripheral surface of the drum 122. Targets are set for these cathodes 123a to 123f, respectively. Specifically, the targets for depositing the SUL 112, the first seed layer 113A, the second seed layer 113B, the first base layer 114A, the second base layer 114B, and the recording layer 115 are respectively set for cathodes 123a, 123b, 123c, 123d, 123e, and 123f. With these cathodes 123a to 123f, the multiple kinds of films, that is, the SUL 112, the first seed layer 113A, the second seed layer 113B, the first base layer 114A, the second base layer 114B, and the recording layer 115 are simultaneously deposited.

The sputtering apparatus 120 which has the above-described configuration is capable of continuously depositing, by a roll-to-roll method, the SUL 112, the first seed layer 113A, the second seed layer 113B, the first base layer 114A, the second base layer 114B, and the recording layer 115.

[Method for Producing Magnetic Recording Medium]

The magnetic recording medium 110 according to the second embodiment can be produced, for example, as follows.

Figure 9:
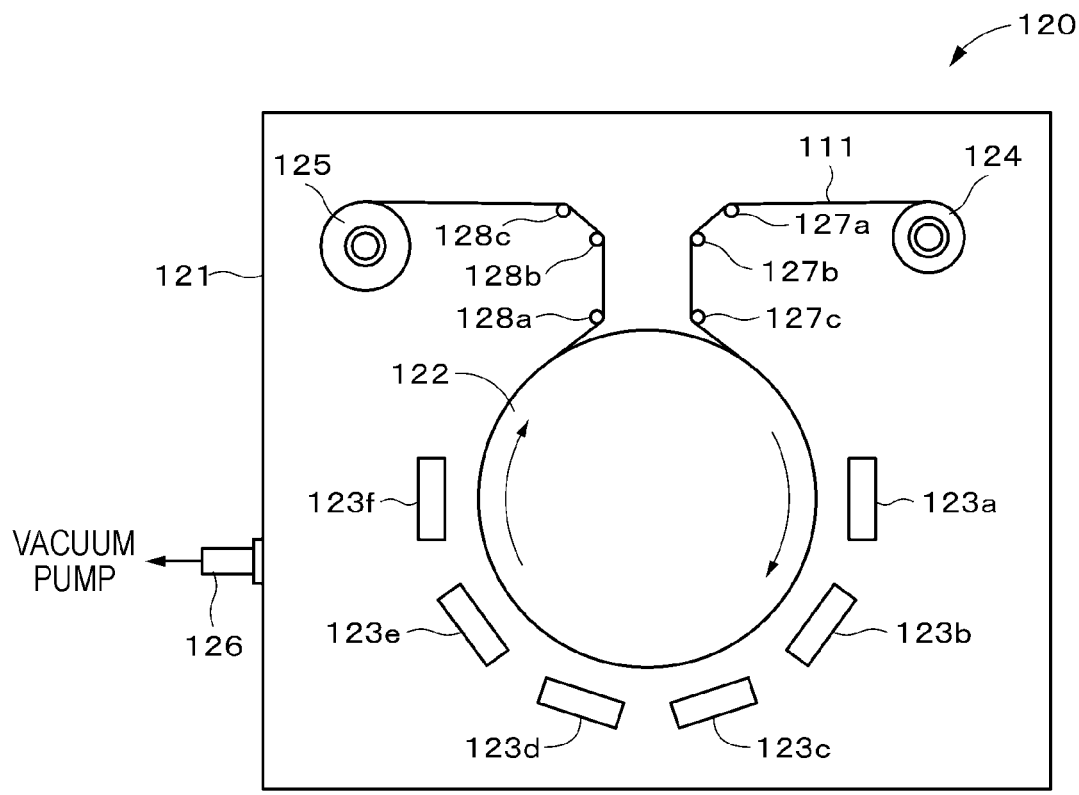
FIG. 9 is a schematic view illustrating the configuration of a sputtering apparatus.

First, the sputtering apparatus 120 shown in FIG. 9 is used to deposit the SUL 112, the first seed layer 113A, the second seed layer 113B, the first base layer 114A, the second base layer 114B, and the recording layer 115 sequentially on the surface of the substrate 111. Specifically, the deposition is performed as follows. First, the deposition chamber 121 is evacuated until reaching a predetermined pressure. Thereafter, the targets set on the cathodes 123a to 123f are sputtered while introducing a process gas such as an Ar gas into the deposition chamber 121. Thus, the SUL 112, the first seed layer 113A, the second seed layer 113B, the first base layer 114A, the second base layer 114B, and the recording layer 115 are sequentially deposited on the surface of the running substrate 111.

The atmosphere of the deposition chamber 121 at the time of sputtering is set to, for example, about $1\times10^{-5}$ Pa to $5\times10^{-5}$ Pa. It is possible to control the thicknesses and characteristics of the SUL 112, first seed layer 113A, second seed layer 113B, first base layer 114A, second base layer 114B, and recording layer 115 by adjusting the tape line speed at which the substrate 111 is wound up, the pressure (sputtering gas pressure) of a process gas such as an Ar gas which is introduced at the time of sputtering, input power, and the like.

Next, a protective layer 116 is deposited on the recording layer 115. As a method for depositing the protective layer 116, for example, a chemical vapor deposition (CVD) method or a physical vapor deposition (PVD) method can be used.

Next, a paint for back layer deposition is prepared by kneading and dispersing a binder, inorganic particles, a lubricant, and the like in a solvent. Next, the back layer 118 is deposited on the back surface of the substrate 111 by applying a paint for back layer deposition on the back surface of the substrate 111 and drying the paint.

Next, for example, a lubricant is applied onto the protective layer 116 to deposit the lubricating layer 117. As a method for applying the lubricant, various application methods can be used, such as gravure coating and dip coating, for example. Next, if necessary, the magnetic recording medium 110 is cut into a predetermined width. Thus, the magnetic recording medium 110 shown in FIG. 8 is obtained.

Advantageous Effect

For the magnetic recording medium 110 according to the second embodiment, as in the first embodiment, the width of the magnetic recording medium 10 can be kept constant or substantially constant by adjusting the tension in the longitudinal direction of the magnetic recording medium 10.

MODIFICATION EXAMPLES

The magnetic recording medium 110 may further include a base layer between the substrate 111 and the SUL 112. The SUL 112 which has an amorphous state, and thus has no role in promoting epitaxial growth of a layer formed on the SUL 112, is required not to disturb the crystal orientation of the first and second base layers 114A and 114B formed on the SUL 112. To that end, the soft magnetic material preferably has a fine structure that forms no column, but in the case of being largely affected by degassing of moisture or the like from the substrate 111, there is a possibility that the soft magnetic material may be coarsened, thereby disturbing the crystal orientation of the first and second base layers 114A and 114B formed on the SUL 112. In order to suppress the influence of degassing of moisture or the like from the substrate 111, it is preferable to provide, between the substrate 111 and the SUL 112, a base layer that includes an alloy containing Ti and Cr and has an amorphous state, as described above. As a specific configuration of the base layer, a configuration can be adopted which is similar to that of the first seed layer 113A according to the second embodiment.

The magnetic recording medium 110 may fail to include at least one of the second seed layer 113B or the second base layer 114B. From the viewpoint of improving the SNR, however, it is more preferable to include both the second seed layer 113B and the second base layer 114B.

The magnetic recording medium 110 may include an antiparallel coupled SUL (APC-SUL) instead of the single-layer SUL.

3 Third Embodiment

[Configuration of Magnetic Recording Medium]

Figure 10:
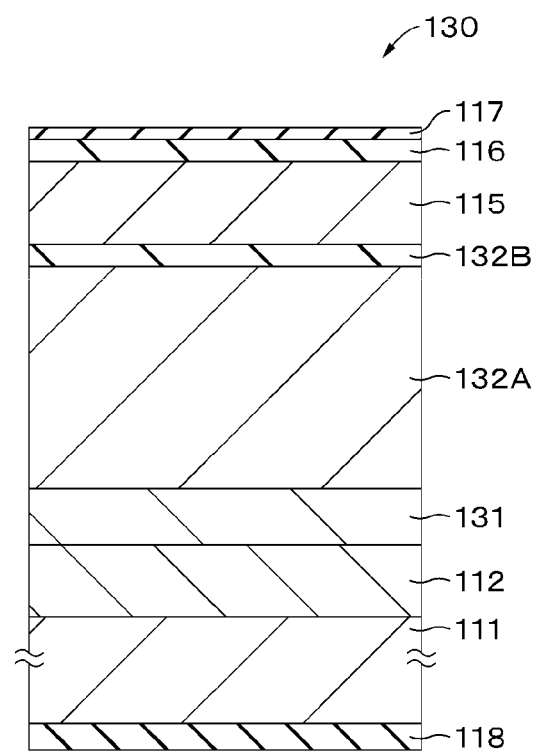
FIG. 10 is a cross-sectional view illustrating the configuration of a magnetic recording medium according to a third embodiment.

As shown in FIG. 10, a magnetic recording medium 130 according to the third embodiment includes a substrate 111, an SUL 112, a seed layer 131, a first base layer 132A, a second base layer 132B, and a recording layer 115. Note that in the third embodiment, parts that are similar to those in the second embodiment are denoted by the same reference numerals, and descriptions thereof will be omitted.

The SUL 112, the seed layer 131, and the first and second base layers 132A and 132B are provided between one main surface of the substrate 111 of the substrate 111 and the recording layer 115, and the SUL 112, the seed layer 131, the first base layer 132A, and the second base layer 132B are stacked in this order in the direction from the substrate 111 toward the recording layer 115.

(Seed Layer)

The seed layer 131 contains Cr, Ni, and Fe, has a face-centered cubic lattice (fcc) structure, and the (111) plane of the face-centered cubic structure is preferentially oriented to be parallel to the surface of the substrate 111. Here, the preferential orientation means a state in which the diffraction peak intensity from the (111) plane of the face-centered cubic lattice structure is higher than the diffraction peaks from other crystal planes in a θ-2θ scan by an X-ray diffraction method, or a state in which only the diffraction peak intensity from the (111) plane of the face-centered cubic lattice structure is observed in a θ-2θ scan by an X-ray diffraction method.

The intensity ratio of X-ray diffraction of the seed layer 131 is preferably 60 cps/nm or more, more preferably 70 cps/nm or more, still more preferably 80 cps/nm or more from the viewpoint of improvement in SNR. Here, the intensity ratio of the X-ray diffraction of the seed layer 131 refers to a value (I/D (cps/nm)) obtained by dividing the intensity I (cps) of the X-ray diffraction of the seed layer 131 by the average thickness D (nm) of the seed layer 131.

The Cr, Ni, and Fe contained in the seed layer 131 preferably have an average composition represented by the following formula (2).

$$Cr_X(Ni_YFe_{100-Y})_{100-X} \qquad (2)$$

(In the formula (2), X falls within the range of $10 \leq X \leq 45$, and Y falls within the range of $60 \leq Y \leq 90$.)

When X falls within the range mentioned above, the (111) orientation of the face-centered cubic lattice structure of Cr, Ni, and Fe is improved, thereby allowing a more favorable SNR to be achieved. Likewise, when Y falls within the range mentioned above, the (111) orientation of the face-centered cubic lattice structure of Cr, Ni, and Fe is improved, thereby allowing a more favorable SNR to be achieved.

The average thickness of the seed layer 131 is preferably 5 nm or more and 40 nm or less. When the average thickness of the seed layer 131 falls within this range, the (111) orientation of the face-centered cubic lattice structure of Cr, Ni, and Fe is improved, thereby allowing a more favorable SNR to be achieved. Note that the average thickness of the seed layer 131 is determined in a similar manner to the recording layer 13 according to the first embodiment. The magnification of the TEM image is, however, adjusted appropriately in accordance with the thickness of the seed layer 131.

(First and Second Base Layers)

The first base layer 132A contains Co and O which have a face-centered cubic lattice structure, and has a column (columnar crystal) structure. The first base layer 132A containing Co and O achieves a substantially similar effect (function) to that of the second base layer 132B containing Ru. The concentration ratio of the average atomic concentration of O to the average atomic concentration of Co ((average atomic concentration of O)/(average atomic concentration of Co)) is 1 or more. When the concentration ratio is 1 or more, the effect of providing the first base layer 132A is improved, thereby allowing a more favorable SNR to be achieved.

The column structure is preferably inclined from the viewpoint of improvement in SNR. The direction of the inclination is preferably the longitudinal direction of the elongated magnetic recording medium 130. It is for the following reason that the longitudinal direction is preferred as just described. The magnetic recording medium 130 according to the present embodiment is a so-called linear recording magnetic recording medium, and the recording track is parallel to the longitudinal direction of the magnetic recording medium 130. Furthermore, the magnetic recording medium 130 according to this embodiment is also a so-called perpendicular magnetic recording medium, and from the viewpoint of recording characteristics, the crystal orientation axis of the recording layer 115 preferably heads in the vertical direction, but the crystal orientation axis of the recording layer 115 may be inclined in some cases due to the influence of the inclination of the column structure of the first base layer 132A. In the magnetic recording medium 130 for linear recording, in relation to the head magnetic field at the time of recording, the configuration in which the crystal orientation axis of the recording layer 115 is inclined in the longitudinal direction of the magnetic recording medium 130 can reduce the influence on the recording characteristics due to the inclination of the crystal orientation axis, as compared with the configuration in which the crystal orientation axis of the recording layer 115 is inclined in the width direction of the magnetic recording medium 130. In order to incline the crystal orientation axis of the recording layer 115 in the longitudinal direction of the magnetic recording medium 130, the inclination direction of the column structure of the first base layer 132A is preferably aligned in the longitudinal direction of the magnetic recording medium 130 as mentioned above.

The inclination angle of the column structure is preferably larger than 0° and not larger than 60°. In the inclination angle range of larger than 0° and not larger than 60°, the tip shape of the column included in the first base layer 132A is largely changed to a substantially triangle shape, and there is thus a tendency to enhance the effect of the granular structure, reduce noise, and improve the SNR. On the other hand, when the inclination angle exceeds 60°, the tip shape of the column included in the first base layer 132A is changed little and unlikely to have a substantially triangular shape, and there is thus a tendency to reduce the low noise effect.

The average particle size of the column structure is 3 nm or more and 13 nm or less. When the average particle size is less than 3 nm, the average particle size of the column structure included in the recording layer 115 is reduced, and there is thus a possibility that the ability of the present magnetic material to retain recording may be degraded. On the other hand, when the average particle size is 13 nm or less, noise is suppressed, thereby allowing a more favorable SNR to be achieved.

The average thickness of the first base layer 132A is preferably 10 nm or more and 150 nm or less. When the average thickness of the first base layer 132A is 10 nm or more, the (111) orientation of the face-centered cubic lattice structure of the first base layer 132A is improved, thereby allowing a more favorable SNR to be achieved. On the other hand, when the average thickness of the first base layer 132A is 150 nm or less, the particle size of the column can be kept from being increased. Accordingly, noise is suppressed, thereby allowing a more favorable SNR to be achieved. Note that the average thickness of the first base layer 132A is determined in a similar manner to the recording layer 13 according to the first embodiment. The magnification of the TEM image is, however, adjusted appropriately in accordance with the thickness of the first base layer 132A.

The second base layer 132B preferably has a crystal structure similar to that of the recording layer 115. In a case where the recording layer 115 includes a Co-based alloy, the second base layer 132B includes a material that has a hexagonal close-packed (hcp) structure similar to that of the Co based alloy, and the c axis of the structure is preferably oriented in a direction perpendicular to the film surface (that is, in the film thickness direction). This is because the orientation of the recording layer 115 can be enhanced, and because the lattice constant matching between the second base layer 132B and the recording layer 115 can be made relatively favorable. As the material that has a hexagonal close-packed structure, it is preferable to use a material containing Ru, and specifically a Ru simple substance or a Ru alloy is preferred. Examples of the Ru alloy include, for example, Ru alloy oxides such as $Ru—SiO_2$, $Ru—TiO_2$, or $Ru—ZrO_2$.

The average thickness of the second base layer 132B may be smaller than that of a base layer (for example, an base layer containing Ru) in a common magnetic recording medium, and can be, for example, 1 nm or more and 5 nm or less. The seed layer 131 and the first base layer 132A which have the configuration described above are provided under the second base layer 132B, thus allowing a favorable SNR to be achieved, even if the average thickness of the second base layer 132B is smaller as described above. Note that the average thickness of the second base layer 132B is determined in a similar manner to that of the recording layer 13 according to the first embodiment. The magnification of the TEM image is, however, adjusted appropriately in accordance with the thickness of the second base layer 132B.

Advantageous Effect

For the magnetic recording medium 130 according to the third embodiment, as in the first embodiment, the width of the magnetic recording medium 10 can be kept constant or substantially constant by adjusting the tension in the longitudinal direction of the magnetic recording medium 10.

The magnetic recording medium 130 according to the third embodiment includes the seed layer 131 and the first base layer 132A between the substrate 111 and the second base layer 132B. The seed layer 131 contains Cr, Ni, and Fe, has a face-centered cubic lattice structure, and the (111) plane of the face-centered cubic structure is preferentially oriented to be parallel to the surface of the substrate 111. The first base layer 132A contains Co and O, and has a column structure in which the ratio of the average atomic concentration of O to the average atomic concentration of Co is 1 or more, and the average particle size is 3 nm or more and 13 nm or less. Thus, the recording layer 115 which has a favorable crystal orientation and a high coercivity can be achieved by reducing the thickness of the second base layer 132B, and using Ru which is an expensive material as little as possible.

The Ru contained in the second base layer 132B has the same hexagonal close-packed lattice structure as Co which is a main constituent of the recording layer 115. For this reason, Ru has the effect of achieving a balance between the improved crystal orientation of the recording layer 115 and the promoted granularity. Furthermore, in order to further improve the crystal orientation of the Ru contained in the second base layer 132B, the first base layer 132A and the seed layer 131 are provided under the second base layer 132B. For the magnetic recording medium 130 according to the third embodiment, the first base layer 132A containing inexpensive CoO that has a face-centered cubic lattice structure achieves a substantially similar effect (function) to that of the second base layer 132B containing Ru. For this reason, the thickness of the second base layer 132B can be reduced. Furthermore, in order to enhance the crystal orientation of the first base layer 132A, the seed layer 131 containing Cr, Ni, and Fe is provided.

EXAMPLES

The present disclosure will be specifically described with reference to examples, but the present disclosure is not to be considered limited to only these examples.

In the following examples and comparative examples, the average thickness $t_T$ of the magnetic tape, the dimensional change amount $\Delta w$ in the width direction of the magnetic tape with respect to the longitudinal tension change of the magnetic tape, the temperature expansion coefficient $\alpha$ of the magnetic tape, the humidity expansion coefficient $\beta$ of the magnetic tape, the Poisson's ratio $\rho$ of the magnetic tape, the elastic limit value $\sigma_{MD}$ in the longitudinal direction of the magnetic tape, the average thickness $t_m$ of the recording layer, the squareness ratio S2, the average thickness $t_b$ of the back layer, the surface roughness $R_b$ of the back layer, and the interlayer friction coefficient $\mu$ between the magnetic surface and the back surface have values obtained by the measuring method described in the first embodiment. As described later, however, in Example 11, the velocity V for measuring the elastic limit value $\sigma_{MD}$ in the longitudinal direction was set to a value different from that in the first embodiment.

Example 1

(Preparation Step of Paint for Recording Layer Formation)

A paint for recording layer formation was prepared as follows. First, a first composition of the following combination was kneaded with an extruder. Next, the kneaded first composition and a second composition of the following combination were added to a stirring tank equipped with a disperser, and preliminarily mixed. Subsequently, the mixture was further mixed with a sand mill, and subjected to a filter treatment to prepare the paint for recording layer formation.

(First Composition)

Powder of ε-iron oxide nanoparticles (ε-$Fe_2O_3$ crystal particles): 100 parts by mass Vinyl chloride resin (cyclohexanone solution 30% by mass): 10 parts by mass (Degree of polymerization: 300, Mn=10000, containing $OSO_3K$=0.07 mmol/g and secondary OH=0.3 mmol/g as polar groups)

Aluminum oxide powder: 5 parts by mass ($\alpha$-$Al_2O_3$, average particle size 0.2 μm)

Carbon black: 2 parts by mass (Manufactured by Tokai Carbon Co., Ltd., trade name: Seast TA)

(Second Composition)

Vinyl chloride resin: 1.1 parts by mass (Resin solution: resin content 30% by mass, cyclohexanone 70% by mass)

n-Butyl stearate: 2 parts by mass

Methyl ethyl ketone: 121.3 parts by mass

Toluene: 121.3 parts by mass

Cyclohexanone: 60.7 parts by mass

Finally, as a curing agent, 4 parts by mass of polyisocyanate (trade name: Coronate L, manufactured by Nippon Polyurethane Industry Co., Ltd.) and 2 parts by mass of myristic acid were added to the paint for recording layer formation, prepared in the way described above.

(Preparation Step of Paint for Base Layer Formation)

A paint for base layer formation was prepared as follows. First, a third composition of the following combination was kneaded with an extruder. Next, the kneaded third composition and a fourth composition of the following combination were added to a stirring tank equipped with a disperser, and preliminarily mixed. Subsequently, the mixture was further mixed with a sand mill, and subjected to a filter treatment to prepare the paint for base layer formation.

(Third Composition)

Acicular iron oxide powder: 100 parts by mass ($\alpha$-$Fe_2O_3$, average major axis length 0.15 μm)

Vinyl chloride resin: 55.6 parts by mass (Resin solution: resin content 30% by mass, cyclohexanone 70% by mass)

Carbon black: 10 parts by mass (Average particle size 20 nm)

(Fourth Composition)

Polyurethane resin UR8200 (manufactured by Toyobo Co., Ltd.): 18.5 parts by mass n-Butyl stearate: 2 parts by mass Methyl ethyl ketone: 108.2 parts by mass Toluene: 108.2 parts by mass Cyclohexanone: 18.5 parts by mass Finally, as a curing agent, 4 parts by mass of polyisocyanate (trade name: Coronate L, manufactured by Nippon Polyurethane Industry Co., Ltd.) and 2 parts by mass of myristic acid were added to the paint for base layer formation, prepared in the way described above.

(Preparation Step of Paint for Back Layer Formation)

A paint for back layer formation was prepared as follows. The following raw materials were mixed in a stirring tank equipped with a disperser, and subjected to a filter treatment to prepare a paint for back layer formation.

Carbon black (manufactured by Asahi Corporation, trade name: #80): 100 parts by mass Polyester polyurethane: 100 parts by mass (Trade name: N-2304, manufactured by Nippon Polyurethane Industry Co., Ltd.)

Methyl ethyl ketone: 500 parts by mass

Toluene: 400 parts by mass

Cyclohexanone: 100 parts by mass (Deposition Step)

With the use of the paints prepared in the way described above, a base layer of 1.0 μm in average thickness and a recording layer of 90 nm in average thickness were formed in the following way on a long polyethylene naphthalate film (hereinafter referred to as a "PEN film") as a non-magnetic support. First, a base layer was formed on the film by applying the paint for base layer formation onto the film and drying the paint. Next, a recording layer was formed on the base layer by applying the paint for recording layer formation onto the base layer and drying the paint. Note that in drying the paint for recording layer formation, the magnetic powder was magnetically oriented by a solenoid coil in the thickness direction of the film. Furthermore, the time of applying the magnetic field to the paint for recording layer formation was adjusted, thereby setting the squareness ratio S2 in the thickness direction (vertical direction) of the magnetic tape to 65%.

Subsequently, a back layer of 0.6 μm in average thickness was applied to the film with the base layer and recording layer formed, and dried. Then, the film with the base layer, recording layer, and backing layer formed was subjected to curing treatment. Subsequently, a calendering treatment was performed to smooth the surface of the recording layer. In this regard, after the condition (temperature) for the calendering treatment was adjusted so that the interlayer friction coefficient μ between the magnetic surface and the back surface was 0.5, a re-curing treatment was performed to obtain a magnetic tape of 5.5 μm in average thickness.

(Step of Cutting)

The magnetic tape obtained in the way described above was cut to a ½-inch (12.65 mm) width. Thus, an intended elongated magnetic tape which has the characteristics shown in Tables 1 and 2 was obtained.

Example 2

The thickness of the PEN film was made smaller than that in Example 1 such that the dimensional change amount Δw was 750 [ppm/N]. In a similar manner to Example 1 except for the foregoing, a magnetic tape was obtained.

Example 3

The thickness of the PEN film was made smaller than that in Example 1 such that the dimensional change amount Δw was 800 [ppm/N], and the average thicknesses of the back layer and base layer were further made smaller. In a similar manner to Example 1 except for the foregoing, a magnetic tape was obtained.

Example 4

The thickness of the PEN film was made smaller than that in Example 1 such that the dimensional change amount Δw was 800 [ppm/N], and the average thicknesses of the back layer and base layer were further made smaller. Moreover, the curing treatment conditions were adjusted for the film with the base layer, recording layer, and back layer formed. In a similar manner to Example 1 except for the foregoing, a magnetic tape was obtained.

Example 5

A magnetic tape was obtained in a similar manner to Example 4 except that the composition of the paint for base layer formation was changed such that the temperature expansion coefficient α was 8 [ppm/° C.].

Example 6

A magnetic tape was obtained in a similar manner to Example 4 except that a thin barrier layer was formed on both surfaces of the PEN film such that the humidity expansion coefficient β was 3 [ppm/% RH].

Example 7

A magnetic tape was obtained in a similar manner to Example 4 except that the composition of the paint for back layer formation was changed such that the Poisson's ratio ρ was 0.31.

Example 8

A magnetic tape was obtained in a similar manner to Example 4 except that the composition of the paint for back layer formation was changed such that the Poisson's ratio ρ was 0.35.

Example 9

A magnetic tape was obtained in a similar manner to Example 7 except that the curing conditions for the film with the base layer, recording layer, and back layer formed were adjusted such that the elastic limit value $\sigma_{MD}$ in the longitudinal direction was 0.8 [N].

Example 10

A magnetic tape was obtained in a similar manner to Example 7 except that the curing conditions and re-curing conditions for the film with the base layer, recording layer, and back layer formed were adjusted such that the elastic limit value $\sigma_{MD}$ in the longitudinal direction was 3.5 [N].

Example 11

A magnetic tape was obtained in a similar manner to Example 9. Then, the elastic limit value $\sigma_{MD}$ of the obtained magnetic tape was measured while the velocity V for measuring the elastic limit value $\sigma_{MD}$ in the longitudinal direction was changed to 5 mm/min. As a result, the elastic limit value $\sigma_{MD}$ in the longitudinal direction was 0.8 without undergoing change with respect to the elastic limit value $\sigma_{MD}$ (Example 9) in the longitudinal direction at the above-mentioned velocity V of 0.5 mm/min.

Example 12

A magnetic tape was obtained in a similar manner to Example 7 except that the coating thickness of the paint for recording layer formation was changed such that the average thickness $t_m$ of the recording layer was 40 nm.

Example 13

(SUL Deposition Step)
First, under the following deposition conditions, a CoZrNb layer (SUL) of 10 nm in average thickness was formed on the surface of a long polymer film as a non-magnetic support. Note that a PEN film was used as the polymer film.
Deposition method: DC magnetron sputtering method
Target: CoZrNb target
Gas species: Ar
Gas pressure: 0.1 Pa
(Deposition Step for First Seed Layer)
Next, a TiCr layer (first seed layer) of 5 nm in average thickness was deposited on the CoZrNb layer under the following deposition conditions.
Sputtering method: DC magnetron sputtering method
Target: TiCr target
Ultimate vacuum: $5 \times 10^{-5}$ Pa
Gas species: Ar
Gas pressure: 0.5 Pa
(Deposition Step for Second Seed Layer)
Next, a NiW layer (second seed layer) of 10 nm in average thickness was deposited on the TiCr layer under the following deposition conditions.
Sputtering method: DC magnetron sputtering method
Target: NiW target
Ultimate vacuum: $5 \times 10^{-5}$ Pa
Gas species: Ar
Gas pressure: 0.5 Pa
(Deposition Step for First Base Layer)
Next, a Ru layer (first base layer) of 10 nm in average thickness was deposited on the NiW layer under the following deposition conditions.
Sputtering method: DC magnetron sputtering method
Target: Ru target
Gas species: Ar
Gas pressure: 0.5 Pa
(Deposition Step for Second Base Layer)
Next, a Ru layer (second base layer) of 20 nm in average thickness was deposited on the Ru layer under the following deposition conditions.
Sputtering method: DC magnetron sputtering method
Target: Ru target Gas species: Ar
Gas pressure: 1.5 Pa
(Deposition Step for Recording Layer)
Next, a (CoCrPt)—(SiO$_2$) layer (recording layer) of 9 nm in average thickness was deposited on the Ru layer under the following deposition conditions.
Deposition method: DC magnetron sputtering method
Target: (CoCrPt)—(SiO$_2$) target
Gas species: Ar
Gas pressure: 1.5 Pa
(Deposition Step for Protective Layer)
Next, a carbon layer (protective layer) of 5 nm in average thickness was deposited on the recording layer under the following deposition conditions.
Deposition method: DC magnetron sputtering method
Target: carbon target
Gas species: Ar
Gas pressure: 1.0 Pa
(Deposition Step for Lubricating Layer)
Next, a lubricant was applied onto the protective layer to form a lubricating layer.
(Deposition Step for Back Layer)
Next, a paint for back layer formation was applied to the surface on the side opposite to the recording layer and dried to form a backing layer of 0.3 μm in average thickness. Thus, a magnetic of 4.0 μm in average thickness was obtained.
(Step of Cutting)
The magnetic tape obtained in the way described above was cut to a ½-inch (12.65 mm) width. Thus, an intended elongated magnetic tape which has the characteristics shown in Tables 1 and 2 was obtained.

Example 14

A magnetic tape was obtained in a similar manner to Example 7 except that the coating thickness of the pint for back layer formation was changed such that the average thickness $t_b$ of the back layer was 0.2 μm.

Example 15

A magnetic tape was obtained in a similar manner to Example 7 except that the composition of the paint for back layer formation was changed such that the surface roughness $R_b$ of the back layer was 3 [nm].

Example 16

A magnetic tape was obtained in a similar manner to Example 7 except that the condition (temperature) for the calendering treatment was adjusted such that the interlayer friction coefficient μ between the magnetic surface and the back surface was 0.2.

Example 17

A magnetic tape was obtained in a similar manner to Example 7 except that the condition (temperature) for the calendering treatment was adjusted such that the interlayer friction coefficient μ between the magnetic surface and the back surface was 0.8.

Example 18

A magnetic tape was obtained in a similar manner to Example 7 except that the coating thickness of the paint for recording layer formation was changed such that the average thickness $t_m$ of the recording layer was 110 nm.

Example 19

A magnetic tape was obtained in a similar manner to Example 7 except that the composition of the paint for back layer formation was changed such that the surface roughness $R_b$ of the back layer was 7 [nm].

Example 20

A magnetic tape was obtained in a similar manner to Example 7 except that the condition (temperature) for the calendering treatment was adjusted such that the interlayer friction coefficient μ between the magnetic surface and the back surface was 0.18.

Example 21

A magnetic tape was obtained in a similar manner to Example 7 except that the condition (temperature) for the calendering treatment was adjusted such that the interlayer friction coefficient μ between the magnetic surface and the back surface was 0.82.

Example 22

A magnetic tape was obtained in a similar manner to Example 7 except that the time of applying the magnetic field to the paint for magnetic layer formation was adjusted, thereby setting the squareness ratio S2 in the thickness direction (vertical direction) of the magnetic tape to 73%.

Example 23

A magnetic tape was obtained in a similar manner to Example 7 except that the application time of the magnetic field to the paint for forming a magnetic layer was adjusted and the squareness ratio S2 in the thickness direction (vertical direction) of the magnetic tape was set to 80%.

Example 24

A magnetic tape was obtained in a similar manner to Example 10 except that the curing conditions and re-curing conditions for the film with the base layer, recording layer, and back layer formed were adjusted such that the elastic limit value $\sigma_{MD}$ in the longitudinal direction was 5.0 [N].

Example 25

A magnetic tape was obtained in a similar manner to Example 7 except that barium ferrite (BaFe$_{12}$O$_{19}$) nanoparticles were used instead of the ε-iron oxide nanoparticles.

Comparative Example 1

A magnetic tape was obtained in a similar manner to Example 1 except that the tensile of the PEN film was changed such that the dimensional change amount Δw was 650 [ppm/N].
(Determination of Amount of Change in Tape Width)
First, a cartridge sample with a ½-inch wide magnetic tape incorporated was prepared. Note that on the magnetic tape, two or more rows of inverted V-shaped magnetic patterns were recorded in advance at mutually known intervals to be parallel to the longitudinal direction. Next, the cartridge sample was moved back and forth in the recording/reproducing device. Then, at the time of reciprocating run, two or more rows of the above-mentioned inverted V-shaped magnetic pattern rows were reproduced simultaneously, and the interval between the magnetic pattern rows at the time of the running was continuously measured from the shape of the reproduced waveform for each row.

Note that at the time of the running, the rotational driving of the spindle driving device and reel driving device is controlled on the basis of the measured information regarding the interval between the magnetic pattern rows, thereby automatically adjusting the tension in the longitudinal direction of the magnetic tape such that the interval between the magnetic pattern rows is a prescribed width or a substantially specified width.

The average of all measured values of the interval between the magnetic pattern rows for one reciprocation was regarded as "the interval measured between the magnetic pattern rows", and the difference between the interval measured between the magnetic pattern rows and "the interval between the known magnetic pattern rows in the recording in advance" was regarded as "a change in tape width".

Furthermore, the reciprocating run by the recording/reproducing device was carried out in a thermo-hygrostat bath. The temperature and the humidity during the reciprocating run were, independently of the reciprocating run mentioned above, gradually and repeatedly changed in accordance with a pre-programmed environmental change program (e.g.: repeating 10° C., 10%→29° C., 80%→10° C., 10% twice; changing the temperature and the humidity for two or more hours) in the temperature range of 10° C. to 45° C. and the relative humidity range of 10% to 80%.

This evaluation was repeated until the "pre-programmed environmental change program" was completed. After the completion of the evaluation, the average value was calculated with the use of all of respective absolute values of "the change in tape width" obtained for each reciprocation, and the value was regarded as "the effective amount of change in tape width" of the tape. The determination in accordance with the discrepancy (desirably smaller) of the "effective amount of change in tape width" from the ideal was made for each tape, and the tapes were each evaluated on the determination values of 8 levels. Note that the evaluation of "8" indicates the most desirable determination result, and the evaluation of "1" indicates the least desirable determination result.

(Evaluation of Electromagnetic Conversion Characteristics)

First, a signal reproduced from the magnetic tape was acquired with the use of a loop tester (manufactured by MicroPhysics, Inc.). Here are conditions for acquiring the reproduced signal.

head: GMR head
speed: 2 m/s
signal: single recording frequency (10 MHz)
Recording current: optimum recording current Next, the reproduced signal was captured with a span (SPAN) of 0 to 20 MHz (resolution band width=100 kHz, VBW=30 kHz) by a spectrum analyzer. Next, the peak of the captured spectrum was referred as a signal amount S, the floor noise excluding the peak was integrated to obtain a noise amount N, and the ratio S/N between the signal amount S and the noise amount N was determined as a signal-to-noise ratio (SNR). Next, the determined SNR was converted to a relative value (dB) based on the SNR according to Comparative Example 1 as a reference medium. Next, the SNR (dB) determined in the way described above was used to determine whether the electromagnetic conversion characteristics were favorable or not in the following way.

Favorable: The SNR of the magnetic tape is equal to or more than the SNR (=0 (dB)) of the evaluation reference sample (Comparative Example 1).

Defective: The SNR of the magnetic tape is less than the SNR (=0 (dB)) of the evaluation reference sample (Comparative Example 1).

(Evaluation of Winding Deviation)

First, the cartridge sample was prepared after the above-mentioned "determination of the amount of change in tape width". Next, the reel with the tape wound thereon was taken out of the cartridge sample, and the end face of the wound tape was visually observed. Note that the reel has flanges, at least one flange is transparent or semi-transparent, and the wound state of the tape inside can be observed through the flange.

As a result of the observation, in a case where the end face of the tape was not flat, with a step or a tape protrusion, the tape was assumed to have a winding deviation. Furthermore, as more steps or tape protrusions were observed, "winding deviation" was assumed to be worse. The above-mentioned determination was made for each sample. The winding deviation of each sample was compared with the winding deviation of Comparative Example 1 as a reference medium to determine whether the winding deviation was favorable or not in the following way.

Favorable: a case where the winding deviation of the sample is equal to or smaller than the winding deviation of the reference sample (Comparative Example 1)

Defective: a case where the winding deviation of the sample is larger than the winding deviation of the reference sample (Comparative Example 1)

Tables 1 and 2 show the configurations and evaluation results of the magnetic tapes according to Examples 1 to 21 and Comparative Example 1.

TABLE 1

| | Magnetic Material | Thickness of Support [μm] | $t_T$ [μm] | Δw [ppm/N] | α [ppm/°C.] | β [ppm/% RH] | ρ | $σ_{MD}$ [N] | V [mm/min] |
|---|---|---|---|---|---|---|---|---|---|
| Example 1 | ε-Iron Oxide | 3.8 | 5.5 | 705 | 5.9 | 5.2 | 0.29 | 0.75 | 0.5 |
| Example 2 | ε-Iron Oxide | 3.2 | 5.0 | 750 | 5.9 | 5.2 | 0.29 | 0.75 | 0.5 |
| Example 3 | ε-Iron Oxide | 3.2 | 4.5 | 800 | 5.9 | 5.2 | 0.29 | 0.75 | 0.5 |
| Example 4 | ε-Iron Oxide | 3.2 | 4.5 | 800 | 6 | 5 | 0.29 | 0.75 | 0.5 |
| Example 5 | ε-Iron Oxide | 3.2 | 4.5 | 800 | 8 | 5 | 0.29 | 0.75 | 0.5 |
| Example 6 | ε-Iron Oxide | 3.2 | 4.6 | 800 | 6 | 3 | 0.29 | 0.75 | 0.5 |
| Example 7 | ε-Iron Oxide | 3.2 | 4.5 | 800 | 6 | 5 | 0.31 | 0.75 | 0.5 |
| Example 8 | ε-Iron Oxide | 3.2 | 4.5 | 800 | 6 | 5 | 0.35 | 0.75 | 0.5 |
| Example 9 | ε-Iron Oxide | 3.2 | 4.5 | 800 | 6 | 5 | 0.31 | 0.8 | 0.5 |
| Example 10 | ε-Iron Oxide | 3.2 | 4.5 | 800 | 6 | 5 | 0.31 | 3.5 | 0.5 |

TABLE 1-continued

|  | Magnetic Material | Thickness of Support [μm] | $t_T$ [μm] | Δw [ppm/N] | α [ppm/°C.] | β [ppm/%RH] | ρ | $σ_{MD}$ [N] | V [mm/min] |
|---|---|---|---|---|---|---|---|---|---|
| Example 11 | ε-Iron Oxide | 3.2 | 4.5 | 800 | 6 | 5 | 0.31 | 0.8 | 5 |
| Example 12 | ε-Iron Oxide | 3.2 | 4.4 | 800 | 6 | 5 | 0.31 | 0.75 | 0.5 |
| Example 13 | ε-Iron Oxide | 3.6 | 4.0 | 800 | 6 | 5 | 0.31 | 0.75 | 0.5 |
| Example 14 | ε-Iron Oxide | 3.2 | 4.4 | 800 | 6 | 5 | 0.31 | 0.75 | 0.5 |
| Example 15 | ε-Iron Oxide | 3.2 | 4.5 | 800 | 6 | 5 | 0.31 | 0.75 | 0.5 |
| Example 16 | ε-Iron Oxide | 3.2 | 4.5 | 800 | 6 | 5 | 0.31 | 0.75 | 0.5 |
| Example 17 | ε-Iron Oxide | 3.2 | 4.5 | 800 | 6 | 5 | 0.31 | 0.75 | 0.5 |
| Example 18 | ε-Iron Oxide | 3.2 | 4.5 | 800 | 6 | 5 | 0.31 | 0.75 | 0.5 |
| Example 19 | ε-Iron Oxide | 3.2 | 4.5 | 800 | 6 | 5 | 0.31 | 0.75 | 0.5 |
| Example 20 | ε-Iron Oxide | 3.2 | 4.5 | 800 | 6 | 5 | 0.31 | 0.75 | 0.5 |
| Example 21 | ε-Iron Oxide | 3.2 | 4.5 | 800 | 6 | 5 | 0.31 | 0.75 | 0.5 |
| Example 22 | ε-Iron Oxide | 3.2 | 4.5 | 800 | 6 | 5 | 0.31 | 0.75 | 0.5 |
| Example 23 | ε-Iron Oxide | 3.2 | 4.5 | 800 | 6 | 5 | 0.31 | 0.75 | 0.5 |
| Example 24 | ε-Iron Oxide | 3.2 | 4.5 | 800 | 6 | 5 | 0.31 | 5.0 | 0.5 |
| Example 25 | Barium Ferrite | 3.2 | 4.5 | 800 | 6 | 5 | 0.31 | 0.75 | 0.5 |
| Comparative Example 1 | ε-Iron Oxide | 3.8 | 5.5 | 650 | 5.9 | 5.2 | 0.29 | 0.75 | 0.5 |

TABLE 2

|  | $t_m$ [nm] | Degree of Orientation | R2 [%] | $t_b$ [μm] | $R_b$ [nm] | μ | Determination | Electromagnetic Conversion Characteristics | Winding Deviation |
|---|---|---|---|---|---|---|---|---|---|
| Example 1 | 90 | substantially vertical | 65 | 0.6 | 6 | 0.50 | 4 | favorable | favorable |
| Example 2 | 90 | substantially vertical | 65 | 0.6 | 6 | 0.50 | 5 | favorable | favorable |
| Example 3 | 90 | substantially vertical | 65 | 0.3 | 6 | 0.50 | 6 | favorable | favorable |
| Example 4 | 90 | substantially vertical | 65 | 0.3 | 6 | 0.50 | 7 | favorable | favorable |
| Example 5 | 90 | substantially vertical | 65 | 0.3 | 6 | 0.50 | 7 | favorable | favorable |
| Example 6 | 90 | substantially vertical | 65 | 0.3 | 6 | 0.50 | 8 | favorable | favorable |
| Example 7 | 90 | substantially vertical | 65 | 0.3 | 6 | 0.50 | 7 | favorable | favorable |
| Example 8 | 90 | substantially vertical | 65 | 0.3 | 6 | 0.50 | 7 | favorable | favorable |
| Example 9 | 90 | substantially vertical | 65 | 0.3 | 6 | 0.50 | 8 | favorable | favorable |
| Example 10 | 90 | substantially vertical | 65 | 0.3 | 6 | 0.50 | 8 | favorable | favorable |
| Example 11 | 90 | substantially vertical | 65 | 0.3 | 6 | 0.50 | 8 | favorable | favorable |
| Example 12 | 40 | substantially vertical | 65 | 0.3 | 6 | 0.50 | 7 | favorable | favorable |
| Example 13 | 9 | vertical | 98 | 0.3 | 6 | 0.50 | 7 | favorable | favorable |
| Example 14 | 90 | substantially vertical | 65 | 0.2 | 6 | 0.50 | 7 | favorable | favorable |
| Example 15 | 90 | substantially vertical | 65 | 0.3 | 3 | 0.50 | 7 | favorable | favorable |
| Example 16 | 90 | substantially vertical | 65 | 0.3 | 6 | 0.20 | 7 | favorable | favorable |
| Example 17 | 90 | substantially vertical | 65 | 0.3 | 3 | 0.80 | 7 | favorable | favorable |
| Example 18 | 110 | substantially vertical | 65 | 0.3 | 6 | 0.50 | 7 | defective | favorable |
| Example 19 | 90 | substantially vertical | 65 | 0.3 | 7 | 0.50 | 7 | defective | favorable |
| Example 20 | 90 | substantially vertical | 65 | 0.3 | 6 | 0.18 | 7 | favorable | defective |
| Example 21 | 90 | substantially vertical | 65 | 0.3 | 6 | 0.82 | 7 | favorable | defective |
| Example 22 | 90 | substantially vertical | 73 | 0.3 | 6 | 0.50 | 8 | favorable | favorable |
| Example 23 | 90 | substantially vertical | 80 | 0.3 | 6 | 0.50 | 8 | more favorable | favorable |
| Example 24 | 90 | substantially vertical | 65 | 0.3 | 6 | 0.50 | 8 | favorable | favorable |
| Example 25 | 90 | substantially vertical | 65 | 0.3 | 6 | 0.50 | 7 | favorable | favorable |
| Comparative Example 1 | 90 | substantially vertical | 65 | 0.6 | 6 | 0.50 | 1 | favorable | favorable |

Note that respective symbols in Tables 1 and 2 mean the following measured values.

$t_T$: the thickness of the magnetic tape

Δw: the dimensional change amount in the width direction of the magnetic tape with respect to the tension change in the longitudinal direction of the magnetic tape α: the temperature expansion coefficient of the magnetic tape β: the humidity expansion coefficient of magnetic tape ρ: the Poisson's ratio of the magnetic tape $σ_{MD}$: the elastic limit value in the longitudinal direction of the magnetic tape V: the velocity for elastic limit measurement $t_m$: the average thickness of the recording layer R2: the squareness ratio in the thickness direction (vertical direction) of the magnetic tape $t_b$: the average thickness of the back layer $R_b$: the surface roughness of the back layer μ: the interlayer friction coefficient between the magnetic surface and the back surface The following is determined Tables 1 and 2.

From the comparison of the evaluation results of Example 1, Comparative Example 1, and the like, it is determined that when the dimensional change amount Δw meets the requirement that 700 [ppm/N]≤Δw, the discrepancy from the ideal of "the effective amount of change in tape width" can be suppressed.

From the comparison of the evaluation results of Examples 1 to 3 and the like, it is determined that the dimensional change amount Δw preferably meets the requirement that 750 [ppm/N]≤Δw, more preferably 800 [ppm/N]≤Δw, from the viewpoint of suppressing the discrepancy from the ideal of "the effective tape width change amount".

From the comparison of the evaluation results of Examples 3, 4, 6, and the like, it is determined that the temperature expansion coefficient α preferably meets the requirement that 6 [ppm/° C.]≤α≤8 [ppm/° C.], from the viewpoint of suppressing the discrepancy from the ideal of "the effective tape width change amount". From the comparison of the evaluation results of Examples 3 to 5 and the like, it is determined that the humidity expansion coefficient β preferably meets the requirement that β≤5 [ppm/% RH], from the viewpoint of suppressing the discrepancy from the ideal of "the effective tape width change amount".

From the comparison of the evaluation results of Examples 6 to 8 and the like, it is determined that the Poisson's ratio ρ preferably meets the requirement that 0.3≤ρ, from the viewpoint of suppressing the discrepancy from the ideal of "the effective tape width change amount".

From the comparison of the evaluation results of Examples 7, 9, 10, 23, and the like, it is determined that the elastic limit value $\sigma_{MD}$ in the longitudinal direction preferably meets the requirement that 0.8 [N]≤$\sigma_{MD}$, from the viewpoint of suppressing the discrepancy from the ideal of "the effective tape width change amount".

The magnetic recording medium according to claim 1, in which the elastic limit values $\sigma_{MD}$ of Examples 9, 11, and the like are independent of the velocity V for the elastic limit measurement.

From the comparison of the evaluation results of Examples 9, 12, 18, and the like, it is determined that the average thickness $t_m$ of the recording layer preferably meets the requirement that $t_m$≤90 [nm] from the viewpoint of improving electromagnetic conversion characteristics.

From the comparison of the evaluation results of Examples 7, 15, 19, and the like, it is determined that the surface roughness $R_b$ of the back layer preferably meets the requirement that $R_b$≤6.0 [nm] from the viewpoint of improving electromagnetic conversion characteristics.

From the comparison of the evaluation results of Examples 7, 16, 17, 21, and the like, it is determined that the interlayer friction coefficient μ between the magnetic surface and the back surface preferably meets the requirement that 0.20≤μ≤0.80, from the viewpoint of suppressing the winding deviation.

From the comparison of the evaluation results of Examples 7, 22, 23, and the like, it is determined that the squareness ratio S2 of the magnetic tape in the vertical direction is preferably 80% or more from the viewpoint of improving electromagnetic conversion characteristics.

From the comparison of the evaluation results of Examples 7, 25, and the like, it is determined that even in a case where barium ferrite nanoparticles are used as the magnetic particles, similar evaluation results to those in a case where ε-iron oxide nanoparticles are used as the magnetic particles are obtained by adjusting the respective parameters such as the dimensional change amount Δw, the temperature expansion coefficient α, and the humidity expansion coefficient β.

Although the embodiments and examples of the present disclosure have been concretely described above, the present disclosure is not to be considered limited to the above-described embodiments and examples, and various modifications can be made, based on the technical idea of the present disclosure.

For example, the configurations, methods, steps, shapes, materials, numerical values, etc. presented in the above-described embodiments and examples are considered merely examples, and if necessary, configurations, methods, processes, shapes, materials, numerical values, etc. may be used which are different from the presented configurations and the like. Furthermore, the chemical formulas of the compounds and the like are considered representative, and not limited to the listed valences or the like, as long as the chemical formulas have common names for the same compounds.

Furthermore, the configurations, methods, steps, shapes, materials, numerical values, etc. of the above-described embodiments and examples can be combined with each other without departing from the scope of the present disclosure.

Furthermore, in this specification, the numerical range indicated with the use of the term "to" indicates the range including the numerical values described before and after the term "to" respectively as the minimum value and the maximum value. In the numerical ranges listed in a stepwise manner in this specification, the upper limit value or lower limit value of the numerical range at a certain stage may be replaced with the upper limit value or lower limit value of the numerical range at the other stage. Unless otherwise specified, the materials exemplified in this specification can be used alone, or two or more thereof can be used in combination.

Furthermore, the present disclosure can adopt the following configuration.

(1)

A magnetic recording medium, in which the average thickness $t_T$ meets the requirement that $t_T$≤5.5 [μm], and the dimensional change amount Δw in the width direction with respect to the tension change in the longitudinal direction meets the requirement that 700 [ppm/N]≤Δw.

(2)

The magnetic recording medium according to (1), in which the dimensional change amount Δw meets the requirement that 750 [ppm/N]≤Δw.

(3)

The magnetic recording medium according to (1) or (2), in which the dimensional change amount Δw meets the requirement that 800 [ppm/N]≤Δw.

(4)

The magnetic recording medium according to any of (1) to (3), in which the temperature expansion coefficient α meets the requirement that 6 [ppm/° C.]≤α≤8 [ppm/° C.], and the humidity expansion coefficient β meets the requirement that β≤5 [ppm/% RH].

(5)

The magnetic recording medium according to any of (1) to (4), in which the Poisson's ratio ρ meets the requirement that 0.3≤ρ.

(6)

The magnetic recording medium according to any of (1) to (5), in which the elastic limit value $\sigma_{MD}$ in the longitudinal direction meets the requirement that 0.8 [N]≤$\sigma_{MD}$.

(7)

The magnetic recording medium according to (6), in which the elastic limit value $\sigma_{MD}$ is independent of the velocity V for the elastic limit measurement.

(8)

The magnetic recording medium according to any of (1) to (7), including a recording layer that is a sputtered layer.

(9)

The magnetic recording medium according to (8), in which the average thickness $t_m$ of the recording layer meets the requirement that 9 [nm]≤$t_m$≤90 [nm].

(10)

The magnetic recording medium according to any of (1) to (7), including a vertically oriented recording layer.

(11)

The magnetic recording medium according to any of (1) to (7), including a recording layer including a magnetic powder.

(12)

The magnetic recording medium according to (11), in which the average thickness $t_m$ of the recording layer meets the requirement that 35 [nm]≤$t_m$≤90 [nm].

(13)

The magnetic recording medium according to (11) or (12), in which the magnetic powder includes an ε-iron oxide magnetic powder, a barium ferrite magnetic powder, or cobalt ferrite magnetic powder.

(14)

The magnetic recording medium according to any of (1) to (13), including a back layer, in which the average thickness $t_b$ of the back layer meets the requirement that $t_b$≤0.6 [μm].

(15)

The magnetic recording medium according to any of (1) to (13), including a back layer, in which the surface roughness $R_b$ of the back layer meets the requirement that $R_b$≤6.0 [nm].

(16)

The magnetic recording medium according to any of (1) to (15), including a magnetic surface and a back surface opposite to the magnetic surface, in which the interlayer friction coefficient μ, between the magnetic surface and the back surface meets the requirement that 0.20≤μ≤0.80.

(17)

The magnetic recording medium according to any of (1) to (16), in which the squareness ratio in the vertical direction is 65% or more.

(18)

A recording/reproducing device for recording on and reproducing from the magnetic recording medium according to any of (1) to (17).

REFERENCE SIGNS LIST

10 Magnetic recording medium
10A Magnetic recording medium cartridge
10B Cartridge case
10C Reel
10S Sample
11 Substrate
12 Base layer
13 Recording layer
14 Back layer
15 Barrier layer
21 Core part
22 Shell part
22a First shell part
22b Second shell part
30 Recording/reproducing device
31 Spindle
32 Reel
33 Spindle driving device
34 Reel driving device
35 Guide roller
36 Head unit
37 Communication interface
38 Control device
41 Server
42 Personal computer
43 Network
110, 130 Magnetic recording medium
111 Substrate
112 Soft magnetic underlayer
113A First seed layer
113B Second seed layer
114A, 132A First base layer
114B, 132B Second base layer
115 Recording layer
116 Protective layer
117 Lubricating layer
118 Back layer
120 Sputtering apparatus
121 Deposition chamber
122 Drum
123a to 123f Cathode
124 Supply reel
125 Take-up reel
126 Exhaust port
127a to 127c, 128a to 128c Guide roll
131 Seed layer
231 Fixing part
232 Support member
232A Slit
233 Weight
234 Light emitter
235 Light receiver It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A magnetic recording medium comprising a recording layer, a nonmagnetic layer, a substrate and a back layer: wherein, an average thickness of the magnetic recording medium $t_T$ satisfies 3.5 μm≤$t_T$≤5.5 μm, the substrate includes polyester resin, a plurality of inverted V-shaped servo patterns is recorded on the recording layer, a squareness ratio in a perpendicular direction of the magnetic recording medium is 65% or more, and a dimensional change amount Δw in a width direction of the magnetic recording medium with respect to a tension change in a longitudinal direction of the magnetic recording medium satisfies 700 ppm/N≤Δw≤8000 ppm/N, and wherein the dimensional change amount Δw is determined according to:

$$\Delta w \text{ [ppm/N]} = \frac{D(0.2N) \text{ [mm]} - D(1.0N) \text{ [mm]}}{D(0.2N) \text{ [mm]}} \times \frac{1{,}000{,}000}{(1.0[N]) - (0.2[N])}$$

where D(0.2N) and D(1.0N) represent widths of a sample of the magnetic recording medium subject to loads of 0.2N and 1.0N, respectively, in the longitudinal direction of the magnetic recording medium and a width of the sample of the magnetic recording medium is ½ inch prior to being subject to a load.

2. The magnetic recording medium according to claim 1, wherein the dimensional change amount Δw satisfies 750 ppm/N≤Δw≤8000 ppm/N.

3. The magnetic recording medium according to claim 1, wherein the dimensional change amount Δw satisfies 800 ppm/N≤Δw≤8000 ppm/N.

4. The magnetic recording medium according to claim 1, wherein
a temperature expansion coefficient α of the magnetic recording medium satisfies 6 ppm/° C.≤α≤8 ppm/° C., and
a humidity expansion coefficient β of the magnetic recording medium satisfies β≤5 ppm/% RH.

5. The magnetic recording medium according to claim 1, wherein a Poisson's ratio p of the magnetic recording medium satisfies 0.3≤p.

6. The magnetic recording medium according to claim 1, wherein an elastic limit value σMD in the longitudinal direction of the magnetic recording medium satisfies 0.8 N≤σMD and the elastic limit value σMD does not depend on a rate V in elastic limit measurement.

7. The magnetic recording medium according to claim 1, wherein an arithmetic mean roughness Ra of a magnetic surface of the magnetic recording medium is 2.0 nm or less.

8. The magnetic recording medium according to claim 1, further comprising a magnetic surface and a back surface on an opposite side to the magnetic surface,
wherein
an interlayer friction coefficient μ between the magnetic surface and the back surface satisfies 0.20≤μ≤0.80.

9. The magnetic recording medium according to claim 1, wherein the squareness ratio in the perpendicular direction of the magnetic recording medium is 73% or more.

10. The magnetic recording medium according to claim 1, wherein a ratio R (=Hc(50)/Hc(25)*100) between a coercive force Hc (50) measured in a perpendicular direction of the magnetic recording medium at 50° C. and a coercive force Hc (25) measured in the perpendicular direction of the magnetic recording medium at 50° C. is 95% or more.

11. The magnetic recording medium according to claim 1, wherein a peak ratio X/Y of a main peak height X of a switching field distribution (SFD) curve measured in a perpendicular direction of the magnetic recording medium to a sub-peak height Y near the zero magnetic field of the switching field distribution (SFD) curve satisfies 3.0≤X/Y≤100.

12. The magnetic recording medium according to claim 1, wherein the recording layer has an average thickness $t_m$ satisfying 35 nm≤$t_m$≤90 nm.

13. The magnetic recording medium according to claim 1, wherein
the recording layer includes a magnetic powder,
the magnetic powder includes an ε iron oxide magnetic powder,
an average maximum particle size D of the ε iron oxide magnetic powder is 8 nm or more and 22 nm or less, and
a coercive force Hc in the perpendicular direction of the magnetic recording medium is 220 kA/m or more and 310 kA/m or less.

14. The magnetic recording medium according to claim 1, wherein
the recording layer includes a magnetic powder,
the magnetic powder includes a hexagonal ferrite magnetic powder,
an average particle size of the hexagonal ferrite magnetic powder is 15 nm or more and 30 nm or less, and
a coercive force Hc in the perpendicular direction of the magnetic recording medium is 170 kA/m or more and 270 kA/m or less.

15. The magnetic recording medium according to claim 1, wherein
the recording layer includes a magnetic powder,
the magnetic powder includes a cobalt ferrite magnetic powder, and
an average particle size of the cobalt ferrite magnetic powder is 25 nm or less.

16. The magnetic recording medium according to claim 1, wherein the substrate comprises one or both of a polyethylene terephthalate (PET) and a polyethylene naphthalate (PEN).

17. The magnetic recording medium according to claim 1, wherein
a surface roughness $R_b$ of the back layer satisfies $R_b$≤6.0 nm.

18. The magnetic recording medium according to claim 1, wherein
an activation volume $V_{act}$ is 8000 nm³ or less.

19. The magnetic recording medium according to claim 1, wherein
the recording layer includes a magnetic powder including a hexagonal ferrite magnetic powder and an average particle size of the hexagonal ferrite magnetic powder is 15 nm or more and 30 nm or less;
a coercive force Hc in a perpendicular direction is 170 kA/m or more and 270 kA/m or less;
an average thickness of the substrate is 2.6 μm or more and 5.0 μm or less;
the substrate comprises one or both of a polyethylene terephthalate (PET) and a polyethylene naphthalate (PEN);
an average thickness of the nonmagnetic layer is 0.6 μm or more and 2.0 μm or less; and
an average thickness $t_b$ of the back layer satisfies $t_b$≤0.6 μm.

20. A magnetic recording cartridge comprising a magnetic recording medium, a reel and a cartridge case, wherein
the magnetic recording medium comprises a recording layer, a nonmagnetic layer, a substrate and a back layer,
an average thickness of the magnetic recording medium $t_T$ satisfies 3.5 μm≤$t_T$≤5.5 μm,
the substrate includes polyester resin,
a plurality of inverted V-shaped servo patterns is recorded on the recording layer,
a squareness ratio in a perpendicular direction of the magnetic recording medium is 65% or more, and
a dimensional change amount Δw in a width direction of the magnetic recording medium with respect to a tension change in a longitudinal direction of the magnetic recording medium satisfies 700 ppm/N≤Δw≤8000 ppm/N, and
wherein the dimensional change amount Δw is determined according to:

$$\Delta W[\text{ppm}/N] = \frac{D(0.2N)\,[\text{mm}] - D(1.0(N))\,[\text{mm}]}{D(0.2N)\,[\text{mm}]} \times \frac{1{,}000{,}000}{(1.0[N]) - (0.2[N])}$$

where D(0.2N) and D(1.0N) represent widths of a sample of the magnetic recording medium subject to loads of 0.2N and 1.0N, respectively, in the longitudinal direction of the magnetic recording medium and a width of the sample of the magnetic recording medium is ½ inch prior to being subject to a load.

* * * * *